(12) United States Patent
Koyama

(10) Patent No.: US 6,742,762 B2
(45) Date of Patent: Jun. 1, 2004

(54) DISPLAY DEVICE HAVING A PIXEL PORTION

(75) Inventor: Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/230,000

(22) Filed: Aug. 28, 2002

(65) Prior Publication Data

US 2003/0045043 A1 Mar. 6, 2003

(30) Foreign Application Priority Data

Aug. 31, 2001 (JP) ........................................ 2001-263018

(51) Int. Cl.$^7$ .............................................. H01L 29/04
(52) U.S. Cl. ............................ 251/59; 257/57; 257/59; 257/72; 257/347; 257/350; 345/99; 349/38
(58) Field of Search ............................. 345/99; 349/38; 257/57, 59, 72, 347, 350

(56) References Cited

U.S. PATENT DOCUMENTS

| | | | |
|---|---|---|---|
| 6,249,325 B1 | * | 6/2001 | Ohkawara et al. ............. 349/38 |
| 6,504,585 B2 | * | 1/2003 | Ohkawara et al. ............. 349/38 |
| 2001/0005194 A1 | | 6/2001 | Hiroki ......................... 345/99 |

FOREIGN PATENT DOCUMENTS

JP 2001-249369 9/2001

OTHER PUBLICATIONS

English Abstract re Japanese Patent Application No. 2001–249639 published Sep. 14, 2001.

* cited by examiner

*Primary Examiner*—David Nelms
*Assistant Examiner*—Mai-Huong Tran
(74) *Attorney, Agent, or Firm*—Cook, Alex, McFarron, Manzo, Cummings & Mehler, Ltd.

(57) ABSTRACT

A display device capable of switching over between vertical and horizontal display on a screen without using a frame memory is provided. A display device has a source signal line driver circuit (102), a first gate signal line driver circuit (103), and a second gate signal line driver circuit (104). The scanning direction of the first gate signal line driver circuit (103) is perpendicular to the scanning direction of the source signal line driver circuit (102), and the scanning direction of the second gate signal line driver circuit (104) is perpendicular to the scanning direction of the first gate signal line driver circuit (103). During normal display, vertical scanning of the screen is performed by the first gate signal line driver circuit (103). Images are displayed in a direction that is in accordance with the scanning direction of the first gate signal line driver circuit (103). On the other hand, vertical scanning of the screen is performed by the second gate signal line driver circuit (104) when switching over between vertical and horizontal display. Images are displayed in a direction that is in accordance with the scanning direction of the second gate signal line driver circuit (104).

27 Claims, 18 Drawing Sheets

Fig. 4A
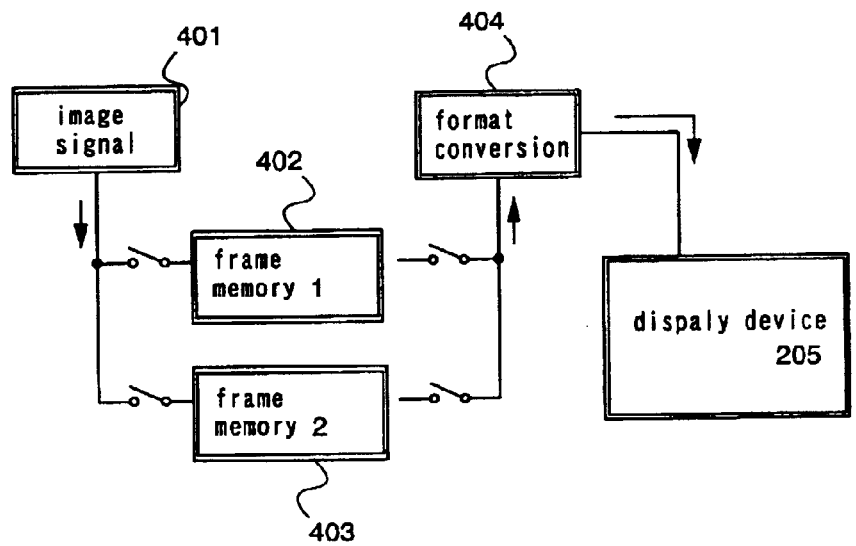
Fig. 4B(i)
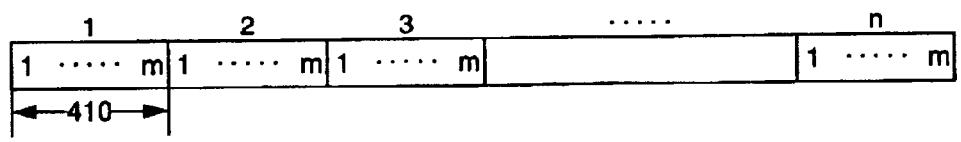
Fig. 4B(ii)
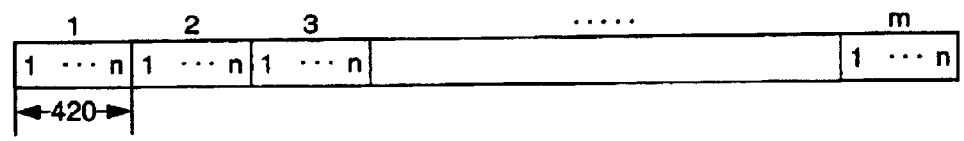

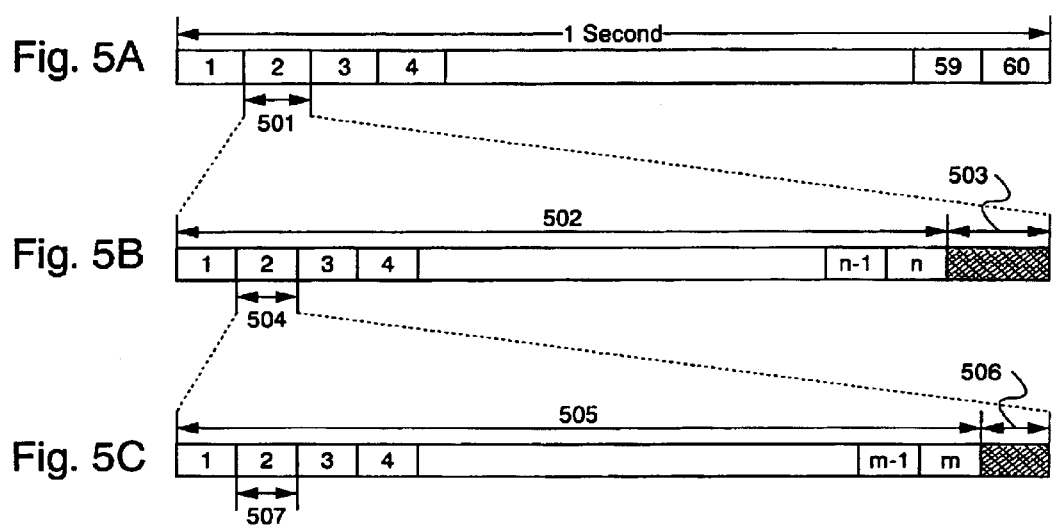

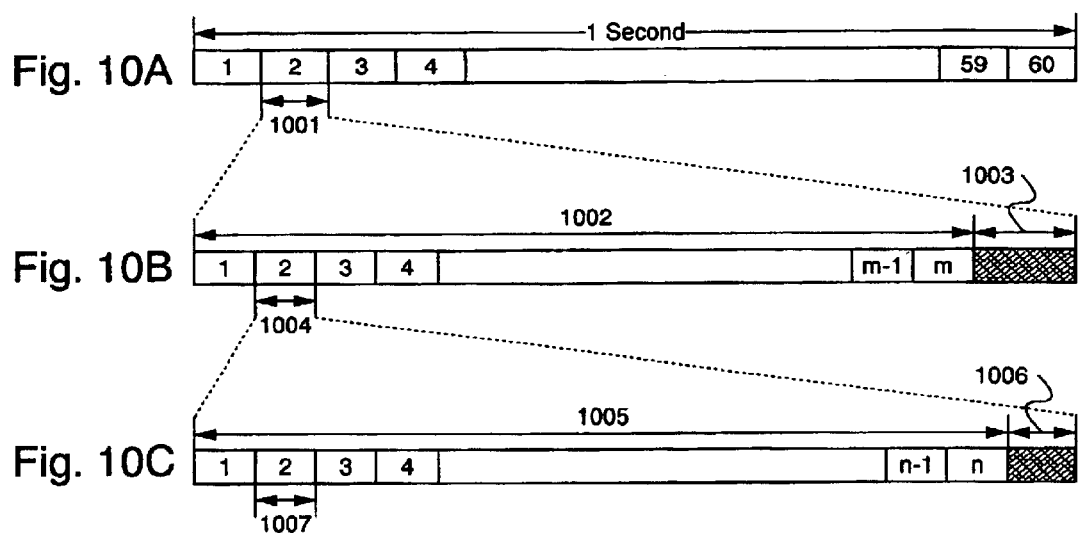

DISPLAY DEVICE HAVING A PIXEL PORTION

BACKGROUND OF THE INVENTION

1. Field of the Invention

The present invention relates to a display device structured by a pixel portion that uses light emitting elements such as liquid crystal elements or electroluminescence elements (EL elements), and to electronic equipment using the display device in a display portion. In particular, the present invention relates to a display device having a pixel portion and a driver circuit for driving the pixel portion formed on the same insulating surface, and to electronic equipment using the display device in a display portion.

2. Description of the Related Art

In recent years, display devices in which semiconductor thin films are formed on an insulating surface such as a glass substrate, in particular electronic circuits using thin film transistors (hereinafter referred to as TFTs), are in use in all fields. In particular, their use in display devices is common, and active matrix display devices such as LCDs (liquid crystal displays) are utilized in many products and widely adopted. Active matrix display devices using TFTs have several hundred thousand to several million pixels arranged in a matrix shape, and image display is performed by controlling the electric charge of each pixel by using TFTs disposed in each pixel.

Recently, techniques relating to polysilicon TFTs have progressed, which are used for simultaneously forming driver circuits on the same substrate by using TFTs in regions that are in the periphery of a pixel portion in addition to pixel TFTs that structure pixels. These techniques contribute greatly to making devices smaller and reducing their electric power consumption. Display devices have thus become indispensable devices used in display portions and the like on mobile information terminals, whose expanded fields of application have become remarkable in recent years.

An example of a general display device is shown in FIG. 2A. FIG. 2A is an example of a liquid crystal display device in which a pixel portion and a driver circuit are integrally formed on an insulating surface. A pixel portion 201 is disposed in a center portion on a substrate 200, and a source signal line driver circuit 202, gate signal line driver circuits 203, and the like are formed in the periphery of the pixel portion 201. Note that although the gate signal line driver circuits 203 are disposed symmetrically on both right and left sides of the pixel portion 201 in FIG. 2A, they may also be placed on only one side. However, it is preferable to arrange the gate signal line driver circuits symmetrically as in FIG. 2A when considering the reliability of circuit operation, efficiency, and the like.

Signals input to the source signal line driver circuit 202 and the gate signal line driver circuits 203 are supplied from the outside through a flexible printed circuit (FPC) 204.

An opposing electrode and the like are formed in an opposing substrate 210, and the opposing substrate 210 and the substrate 200 are bonded through a sealing agent 205 while maintaining a certain gap. A liquid crystal material is then injected into the gap between the substrate 200 and the opposing substrate 210 from an injection port prepared in advance. The injection port is then sealed tightly by using a sealant 206.

m source signal lines and n gate signal lines are disposed orthogonally in the pixel portion 201 as shown in FIG. 2B. There are m source signal lines and n gate signal lines in FIG. 2B. Locations 220 at which the source signal lines and the gate signal lines intersect form pixels as shown in FIG. 2C. The pixel comprises a source signal line 221, a gate signal line 222, a pixel TFT 223, a liquid crystal element 224, a storage capacitor 225, and an opposing electrode 226. The number of pixels here is m×n pixels.

Operation of the display device is explained simply with reference to FIGS. 5A to 5C. In general, screen drawing is performed on the order of 60 times per second so that pixel flicker is not recognizable by human eyes. A period denoted by reference numeral 501, that is, a period necessary to draw the screen one time, is referred to as one frame period here (see FIG. 5A).

Selection of the gate signal lines is performed in sequence from a first row in one frame period. A selection period 504 per one row is denoted as a horizontal period. A period 502 up until selection of the final row (number n row) is complete is denoted as a line scanning period. Similar operations are then performed in the next frame period, sandwiching a vertical return period 503 (see FIG. 5B).

Write-in of the image signal in sequence to the pixels of the selected row is performed in one horizontal period from the source signal lines. This period, a period 505, is denoted as a dot sampling period. A period 507 necessary for writing in an image signal to one pixel is denoted as one dot sampling period. When write-in of the image signal in one row portion of pixels is complete, similar operations are performed in the next horizontal period, sandwiching a horizontal return period 506 (see FIG. 5C).

Specific circuit operation is explained next. FIG. 6A is an example of the structure of the source signal line driver circuit of the display device, and has a shift register 602 that uses a plurality of stages of flip-flops (FFs) 601, a NAND 603, a buffer 604, and a sampling switch 605. Operation is explained with reference to FIG. 6B. The shift register 602 outputs pulses in order from the first stage in accordance with a clock signal (CK), a clock inverted signal (CKb), and a start pulse (SP).

In the case where the pulses output from the shift register 602 overlap in adjacent stages, they are input to the NAND 603 and pulses that do not overlap in adjacent stages are formed. The NAND output then passes through the buffer 604, and becomes sampling pulses.

When the sampling pulses are input to the sampling switch 605, the sampling switch 605 is turned on, and the electric potential of an image signal (Video) charges the source signal line connected to the sampling switch during that period. At the same time, the image signal is written into one pixel connected to the source signal line of the row whose gate signal line is selected. In FIG. 6B, a period denoted by reference numeral 610 is one dot sampling period.

A gate signal line driver circuit shown in FIG. 7A is explained next. The structure from a shift register to a buffer is nearly the same as that of the source signal line driver circuit, and the gate signal line driver circuit has a shift register 702 that comprises a plurality of stages of flip-flops 701, a NAND 703, and a buffer 704.

Operation is explained with reference to FIG. 7B. Similarly to the source signal line driver circuit, the shift register 702 outputs pulses in order from the first stage in accordance with the clock signal (CK), the clock inverted signal (CKb), and the start pulse (SP).

In the case where the pulses output from the shift register 702 overlap in adjacent stages, they are input to the NAND

703 and pulses that do not overlap in adjacent stages are formed. The NAND output then passes through the buffer 704, and becomes gate signal line selection pulses.

As stated above, the image signal written into the source signal line is then written into each of the pixels in the row to which a gate signal line selection pulse is input. In FIG. 7B, a period denoted by reference numeral 710 is one horizontal period, and a period denoted by reference numeral 720 is the one dot sampling period mentioned above.

In the case where the display device has many functions, such as with a personal computer, the display device may be used in a horizontal format for certain applications, and in a vertical format in other applications. For cases such as this, there is a method of displaying in a state in which a display device frame is rotated by 90°, as shown in FIG. 3A.

A pixel portion of an active matrix display device has m×n pixels arranged in a matrix shape as shown in FIG. 2B. Write-in of an image signal is performed in sequence from a pixel at coordinate (1,1), followed by (1,2), (1,3), and (1,4). One horizontal period is complete when (1,m) is reached. This is repeated n times, and write-in of one screen is complete when write-in is performed to the final pixel at coordinate (m,n).

Once again return to FIG. 3A. In the case of horizontal format display (left side) and vertical format display (right side), the pixels at coordinate (1,1) into which write-in is performed first are denoted by reference numerals 301 and 302, respectively. Considering cases of performing display of similar images in horizontal format display and vertical format display, the input order is in sequence from the upper left to the upper right, and on downward to the lower right when the image signal input corresponds to horizontal format display, as shown in FIG. 3A. In the case of performing vertical format display using this image signal, the write-in order to the display device itself does not change, and therefore the sequence for inputting the image signal must be from the upper right to the lower right, and then leftward toward the lower left.

However, it is preferable to be able to perform switch over to horizontal format display flexibly with the display device, and therefore the preparation of image signal having different formats is not efficient. Display is then performed using a frame memory, storing the image signal temporarily in the memory and then reading it out.

A frame memory is for storing the image signal of each pixel in respective memory cells, and it is therefore possible to read out from arbitrary addresses, irrespective of the write-in order. By changing the readout order of the image signal written temporarily into the frame memory, switch over between vertical and horizontal display can be performed.

The frame memory for storing one frame portion of an image signal has memory circuits managed by addresses, as shown in FIG. 3B. When the image signal is input, it is therefore written in sequence into the addresses (1,1), (2,1), . . . , (m,1), (1,2), (2,2), . . . , (m,2), . . . , (1,n), (2,n), . . . , and (m,n). For horizontal format display, readout is performed in the same sequence as the write-in.

On the other hand, for vertical format display, readout is performed in sequence from the addresses (m,1), (m,2), . . . , (m,n), (m−1,1), (m−2,2), . . . , (m−1,n), . . . , (1,1), (1,2), . . . , and (1,n), when display as in FIG. 3A is desired.

Further, the frame memory generally has at least two frame portions formed, as shown in FIG. 4A. During a period in which write-in to one of the frame memories is performed, readout from the other frame memory is performed, thus performing display.

The display device can thus perform switch over between vertical and horizontal screens by using normal drive as is. However, the number of pixels in the horizontal and vertical directions of the display device is normally different, and therefore it is necessary to change the format of the image signal at the same time as performing switch over between vertical and horizontal displays.

The image signal is structured by a total of n row portions of image signals: an image signal to be written into the pixels 1 to m of the number 1 row, an image signal to be written into the pixels 1 to m of the number 2 row, . . . , an image signal to be written into the pixels of the number n row, as shown in FIG. 4B(i). In this case, the signal corresponds to m(side)×n(length) pixels. To perform switch over between horizontal and vertical display, it is necessary to convert to a shape corresponding to −n columns of pixels horizontally by m rows of pixels vertically, as shown in FIG. 4B(ii). This operation is referred to as format conversion. Known techniques may be used for the format conversion process itself, and therefore the details are omitted here.

For instance, in case of m(side)×n(length) pixels, an image signal corresponding to one frame period is formed by gathering image signals of n lines, each image signal corresponding to one dot sampling period×m dots. When length and side of the screen change places, it becomes a display region of n(side)×m(length) pixels. The image signal for one frame period need to reconstitute so as to be an image signal corresponding to one frame period that is formed by gathering image signals of m lines, each image signal corresponding to one dot sampling period×n dots.

Here, horizontal element changes from m dots to n dots. When one dot sampling period is the same, the length of one horizontal period becomes n/m. image signal corresponding to one horizontal period is reconstituted by expanding or shortened the image signal corresponding to one horizontal period to suit the n/m length of one horizontal period and sampling of n dots.

On the other hand, it is not possible to correspond by the change in the sampling frequency because the number of lines increase and decrease to the element of the vertical direction. Therefore, it is done by increasing the number of lines a frame by thinning out a part of image signal and decreasing the number of lines a frame, and inputting a part of image signal oppositely two or more lines (For instance, two lines are continued) more than once.

Such a function is offered with IC chip installed beforehand outside, and the converted resolution has been decided to several kinds beforehand but usually;

The method of doing the format conversion high-quality and efficiently is indicated in open 2001-246939 special titles etc., and you may use such a technique.

Various types of software are recently being supplied even to small size portable terminals such as mobile phones, and there is a tendency for one unit to have more and more uses. A vertical and horizontal display switch over technique such as one described above therefore becomes very important.

However, a frame memory is prepared as externally mounted, separate from the display device. That is, the number of component parts increases. In particular, compact portable terminals have grown increasingly smaller recently, and therefore it is difficult to add an additional externally mounted frame memory to present day size terminals. Performing switch over between horizontal and vertical display by a conventional method is therefore not preferable for small size portable terminals.

SUMMARY OF THE INVENTION

In view of the aforementioned problems, an object of the present invention is therefore to provide a display device capable of switching between horizontal and vertical display without adding a frame memory or the like.

The display device of the present invention has a source signal line driver circuit, the first gate signal line driver circuit, and the second gate signal line driver circuit. At this point, the scanning line direction of the second gate signal line and the first gate signal line driver circuit cross at right angle each other.

Here, the scanning line direction cross to a row of signal lines that are controlled by respective driver circuits. A general display is described as the first display, on the contrary, in the case of performing switch over between horizontal and vertical display is described as the second display.

In the case of the general display, the vertical scanning is performed by the first gate signal line driver circuit. An image is displayed according to the scanning direction of the first gate signal line. On the other hand, in the case of the second display, the vertical scanning is performed by the second gate signal line driver circuit. An image is displayed according to the scanning direction of the second gate signal line.

The construction of the present invention is described as follows.

A display device of the present invention is characterized in that:
  a conversion portion into which a first image signal is input, and a second image signal is obtained by converting the format of the first image signal; and
  a display portion into which the first image signal or the second image signal is input to display an image therein;
  wherein:
    the first image signal is input to the display portion and a first image is displayed therein; and
    the first image signal or the second image signal is input to the display portion, and a second image having a display direction rotated by 90° with respect to the first image is displayed.

A display device of the present invention is characterized in that:
  a conversion portion into which a first image signal is input, and a second image signal is obtained by converting the format of the first image signal; and
  a display portion into which the first image signal or the second image signal is input to display an image therein;
  wherein:
    the display portion has a source signal line driver circuit, a first gate signal line driver circuit, a second gate signal line driver circuit, and a plurality of pixels;
    the source signal line driver circuit, the first gate signal line driver circuit, the second gate signal line driver circuit, and the plurality of pixels are formed on the same substrate; and
    a scanning direction of the first gate signal line driver circuit and a scanning direction of the second gate signal line driver circuit are orthogonal.

A display device of the present invention is characterized in that:
  a conversion portion into which a first image signal is input, and a second image signal is obtained by converting the format of the first image signal; and
  a display portion into which the first image signal or the second image signal is input to display an image therein;
  wherein:
    the display portion has a source signal line driver circuit, a first gate signal line driver circuit, a second gate signal line driver circuit, and a plurality of pixels;
    the source signal line driver circuit, the first gate signal line driver circuit, the second gate signal line driver circuit, and the plurality of pixels are formed on the same substrate;
    the plurality of pixels each have a source signal line, a first gate signal line, a second gate signal line orthogonal to the first gate signal line, a first transistor, and a second transistor;
    a gate electrode of the first transistor is electrically connected to the first gate signal line, an input electrode of the first transistor is electrically connected to the source signal line, and an output electrode of the first transistor is electrically connected to an input electrode of the second transistor; and
    a gate electrode of the second transistor is electrically connected to the second gate signal line.

The display device of the present invention is characterized in that:
  the driver frequency of the source signal line driver circuit is higher than the driver frequency of the first gate signal line driver circuit when displaying a first image; and
  the driver frequency of the source signal line driver circuit is lower than the driver frequency of the first gate signal line driver circuit when displaying a second image.

A display device of the present invention is characterized in that:
  a conversion portion into which a first image signal is input, and a second image signal is obtained by converting the format of first image signal; and
  a display portion into which the first image signal or the second image signal is input to display an image therein;
  wherein:
    the display portion has a first source signal line driver circuit, a second source signal line driver circuit, a first gate signal line driver circuit, a second gate signal line driver circuit, and a plurality of pixels;
    the first source signal line driver circuit, the second source signal line driver circuit, the first gate signal line driver circuit, the second gate signal line driver circuit, and the plurality of pixels are formed on the same substrate; and
    a scanning direction of the first gate signal line driver circuit and a scanning direction of the second gate signal line driver circuit are orthogonal.

A display device of the present invention is characterized in that:
  a conversion portion into which a first image signal is input, and a second image signal is obtained by converting the format of the first image signal; and
  a display portion into which the first image signal or the second image signal is input to display an image therein;
  wherein:
    the display portion has a first source signal line driver circuit, a second source signal line driver circuit, a first gate signal line driver circuit, a second gate signal line driver circuit, and a plurality of pixels;

the first source signal line driver circuit, the second source signal line driver circuit, the first gate signal line driver circuit, the second gate signal line driver circuit, and the plurality of pixels are formed on the same substrate;

the plurality of pixels each have a first source signal line, a second source signal line, a first gate signal line, a second gate signal line orthogonal to the first gate signal line, a first transistor, and a second transistor;

a gate electrode of the first transistor is electrically connected to the first gate signal line, an input electrode of the first transistor is electrically connected to the first source signal line; and a gate electrode of the second transistor is electrically connected to the second gate signal line, and the input electrode is electrically connected to the second source signal line.

The display device of the present invention is characterized in that:

an image is displayed in accordance with a scanning direction of the first gate signal line driver circuit when displaying the first image; and an image is displayed in accordance with a scanning direction of the second gate signal line driver circuit when displaying the second image.

The display device of the present invention is characterized in that:

wherein each of the plurality of pixels has means for applying a driver voltage to a liquid crystal element or means for supplying electric current to a light emitting element.

By using the display device of the present invention, a liquid crystal display, an EL display, a portable information terminal, or an electronic apparatus such as cell phones can be provided.

A BRIEF DESCRIPTION OF THE DRAWINGS

Figure 6A:
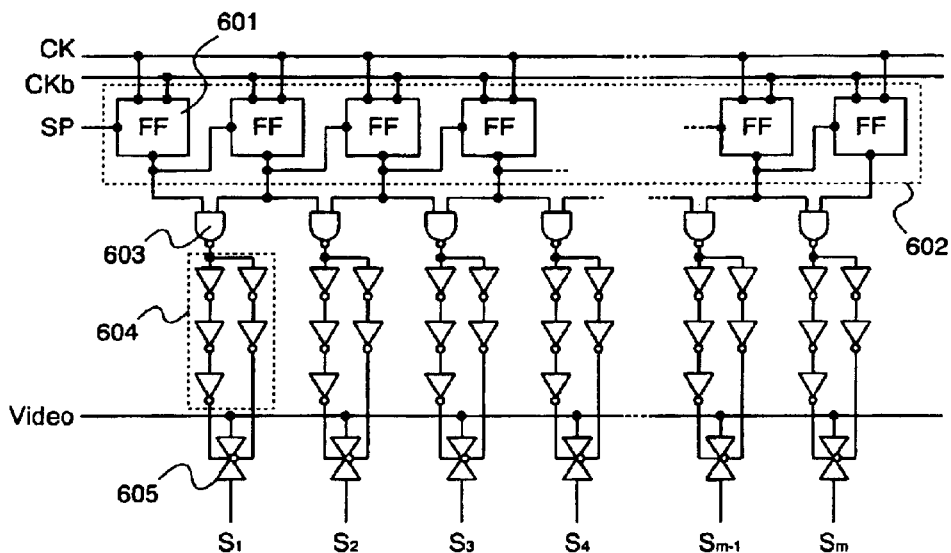
Figure 6B:
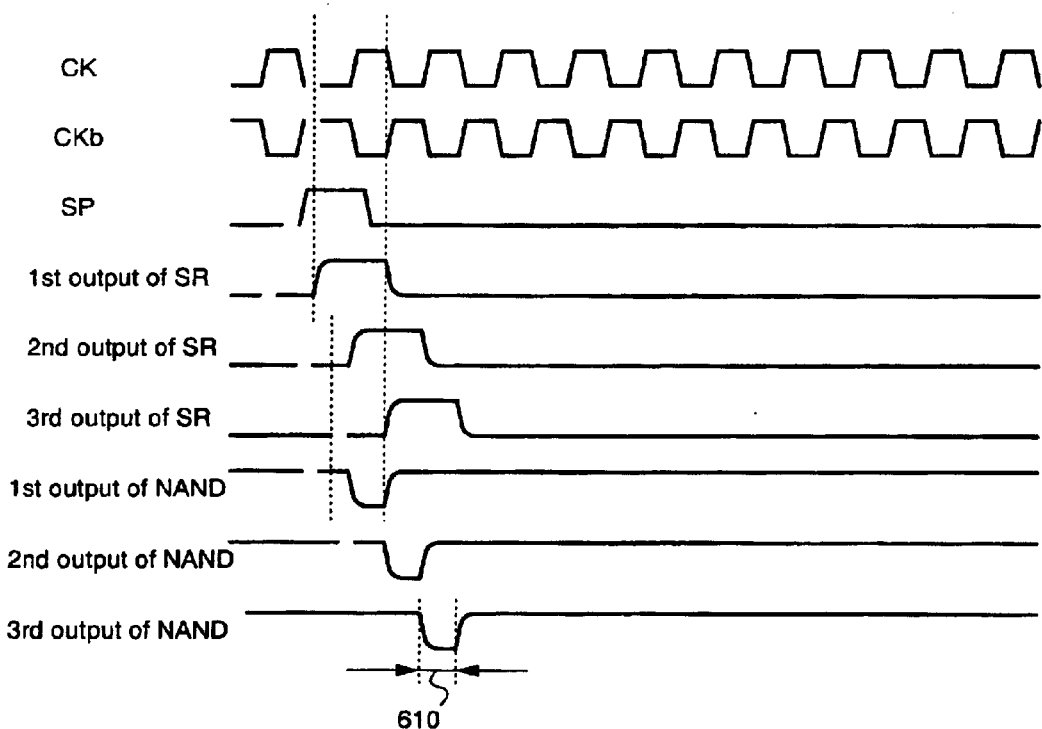
Figure 7A:
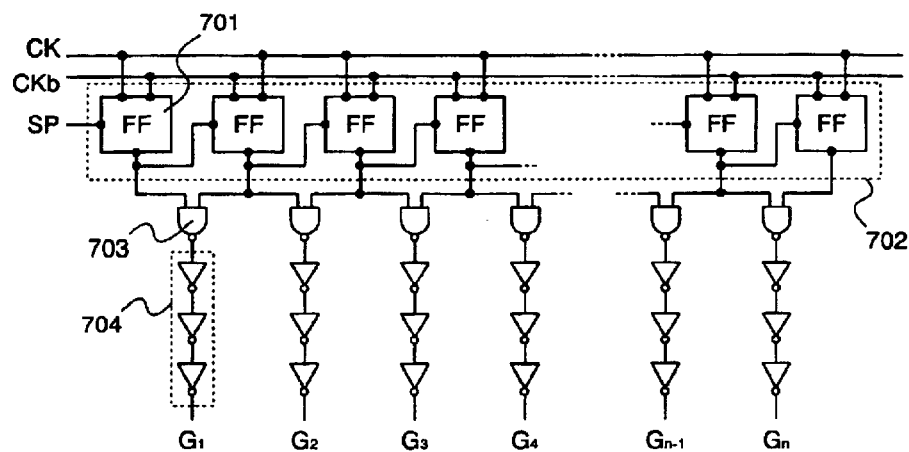
Figure 7B:
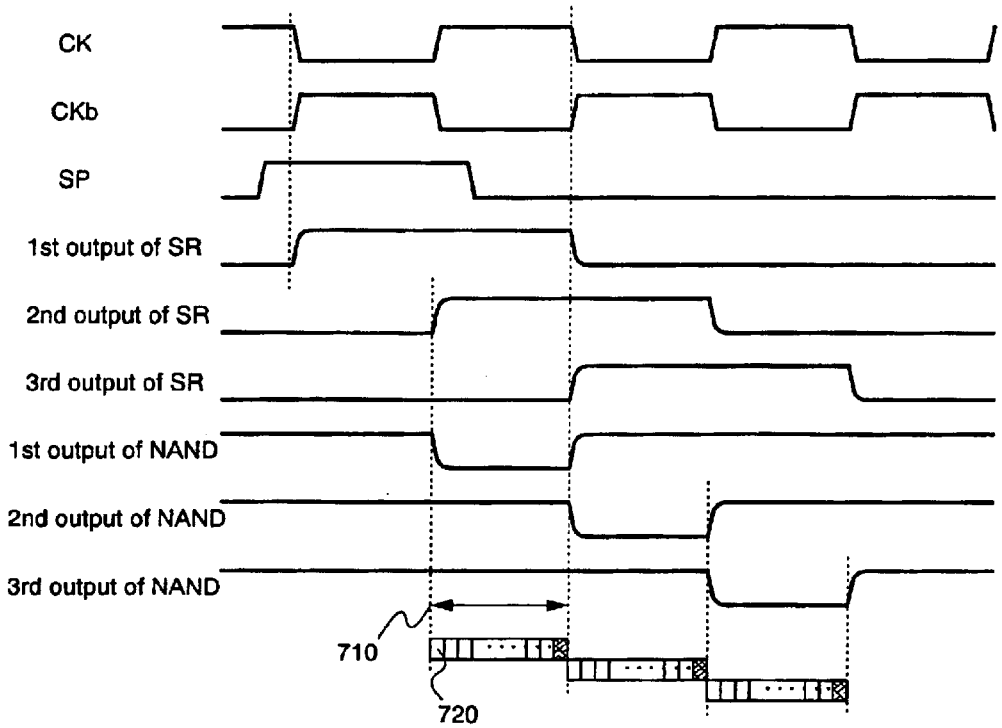
Figure 8A:
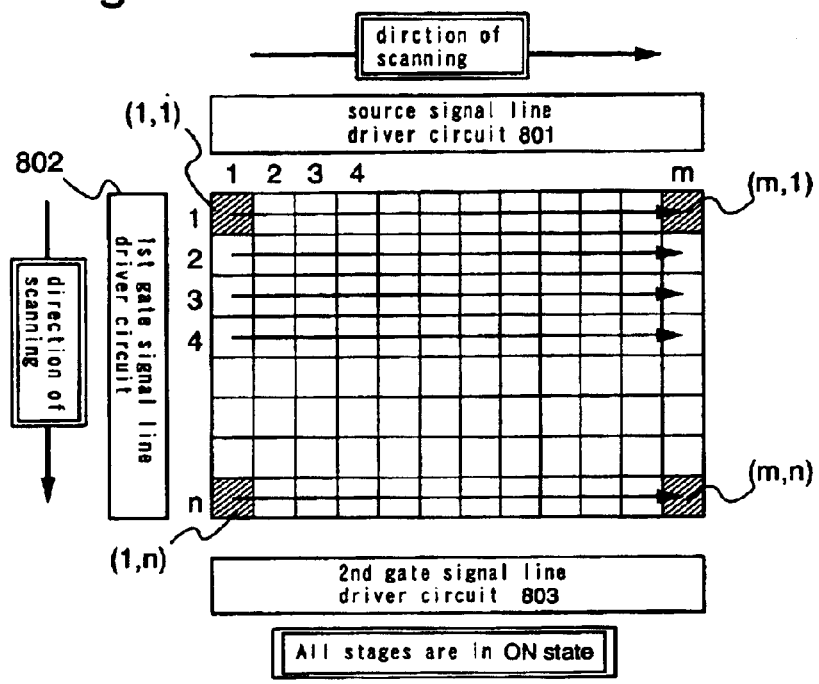
Figure 8B:
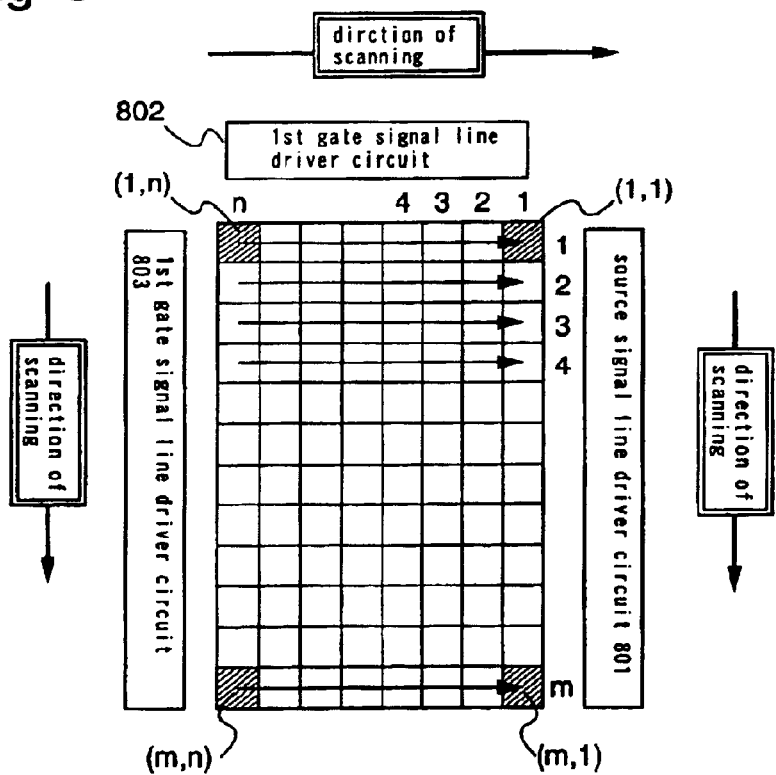
Figure 9:
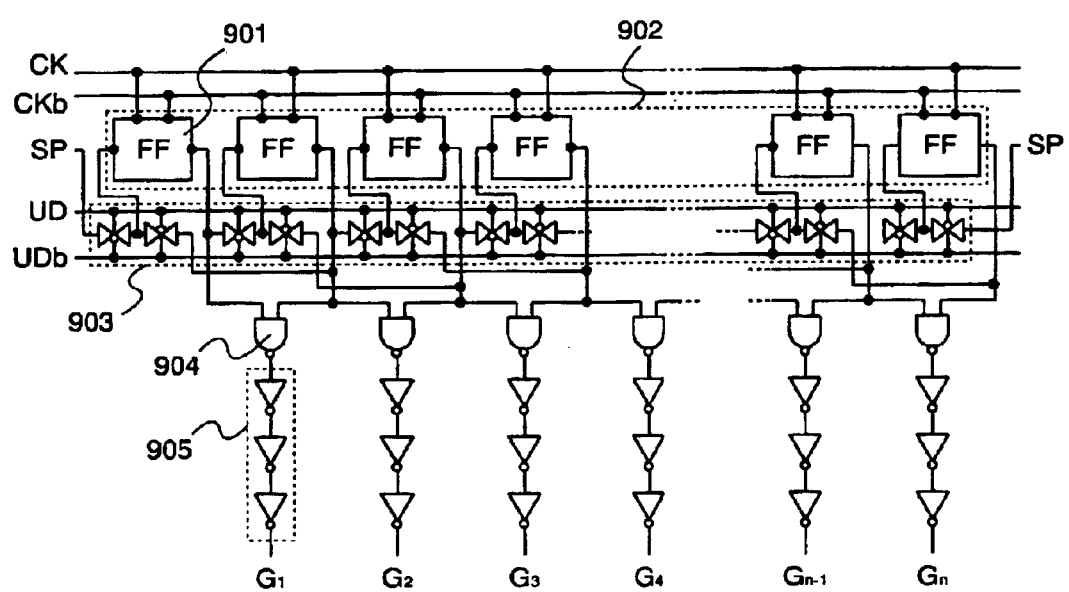
Figure 11A:
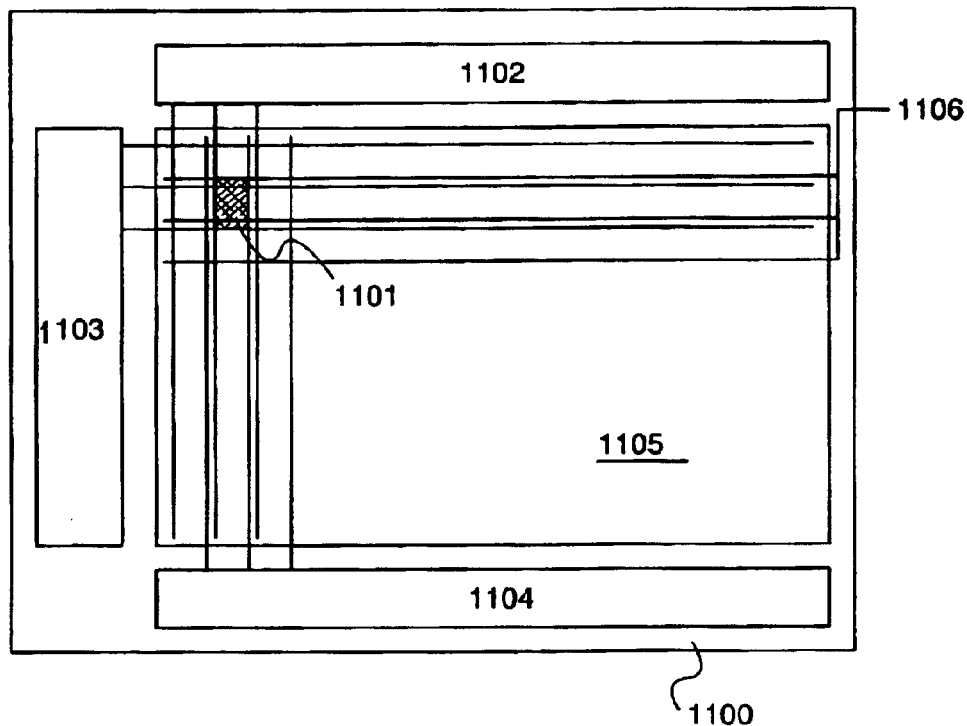
Figure 11B:
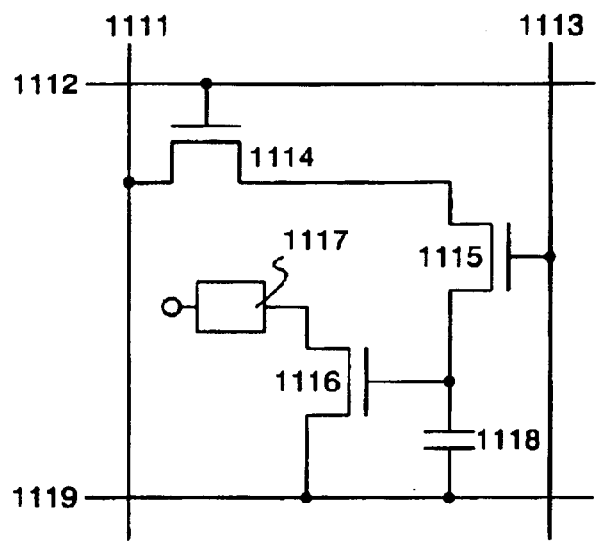
Figure 12A:
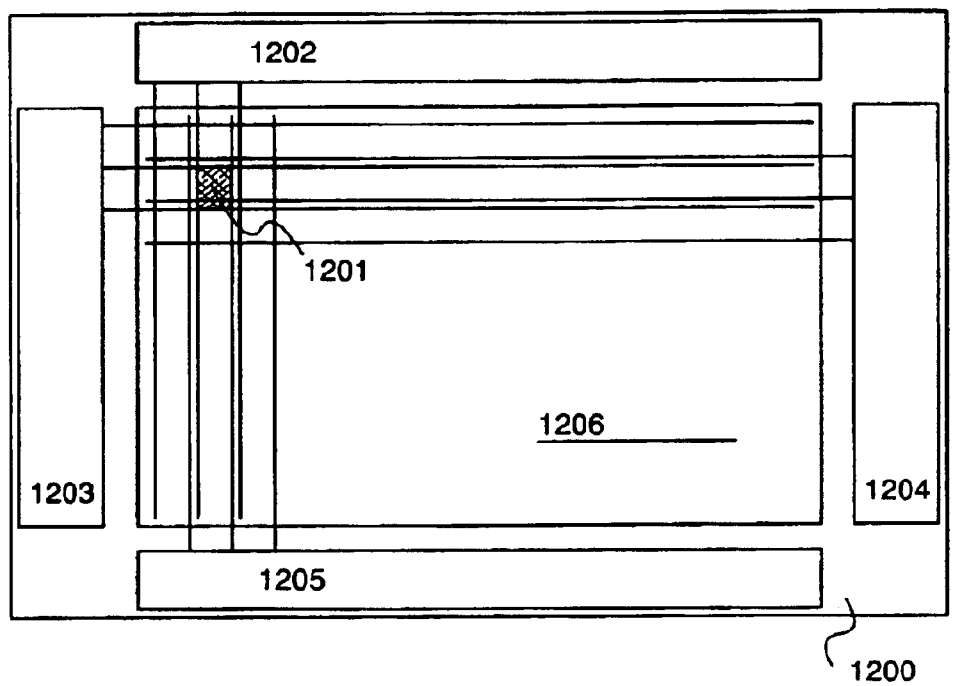
Figure 12B:
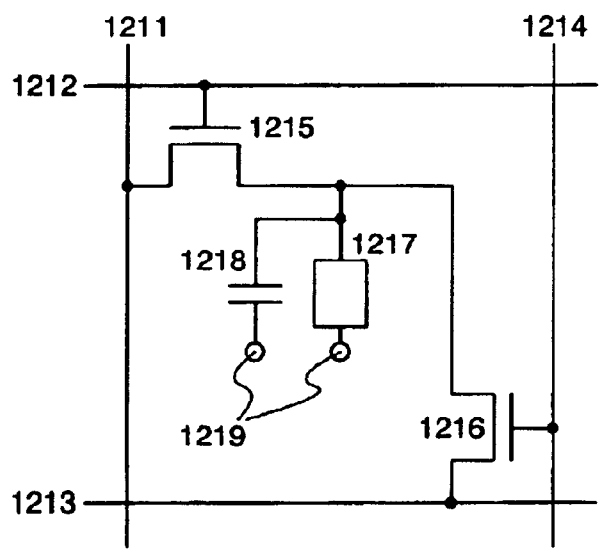
Figure 13A:
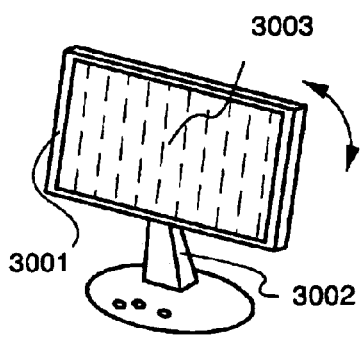
Figure 13B:
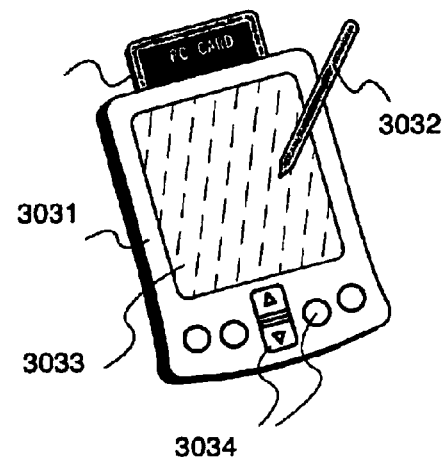
Figure 13C:
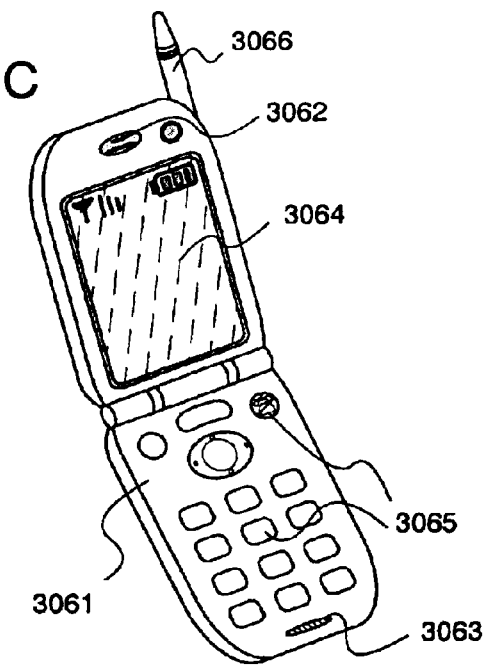
Figure 14:
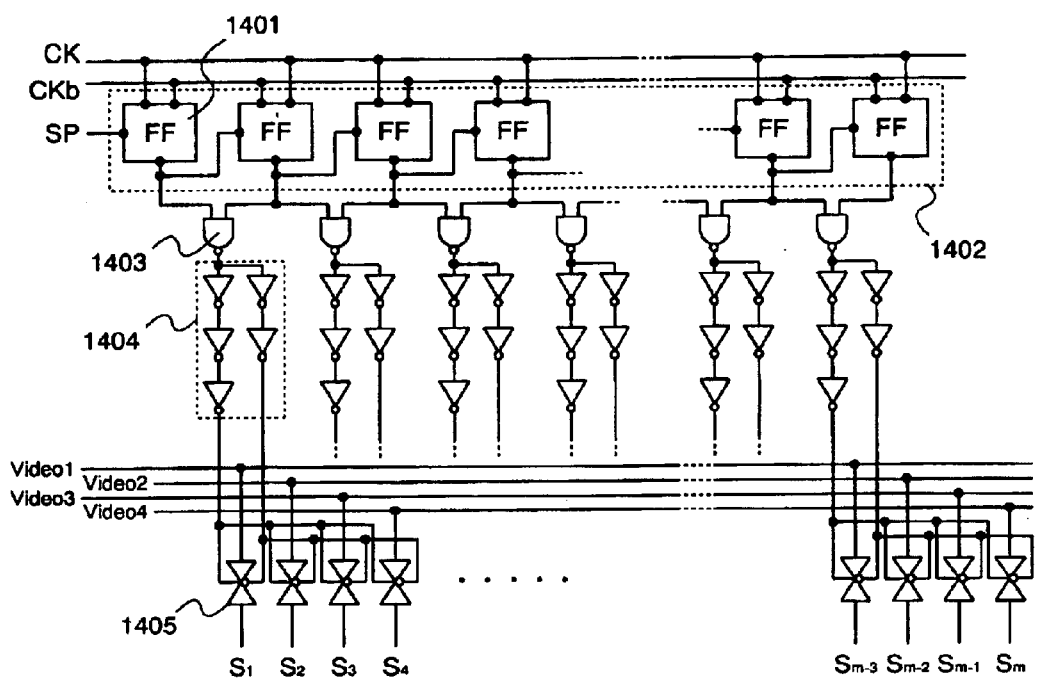
Figure 18:
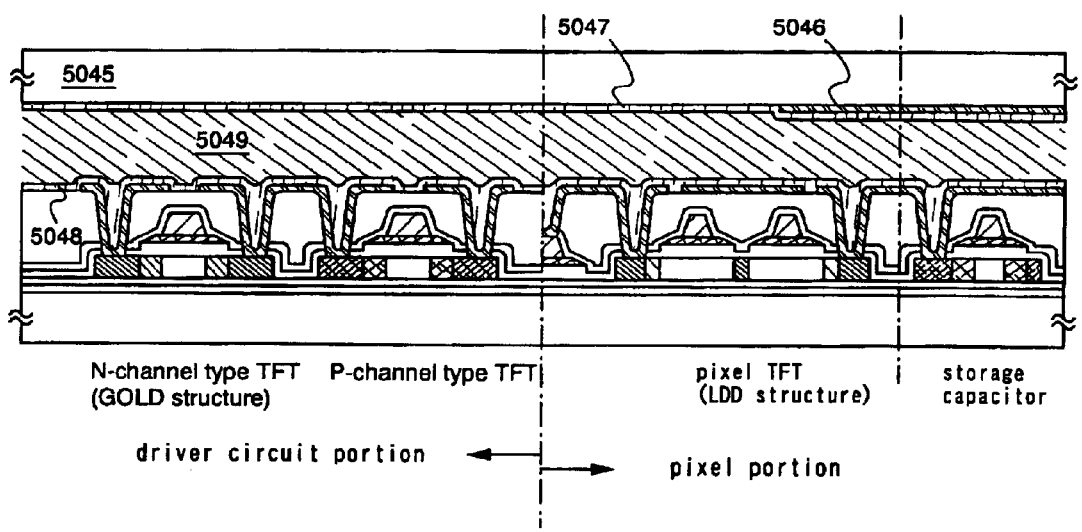

FIGS. 4A, 4B(i) and 4B(ii) are diagrams showing the case of using a frame memory for switching between horizontal and vertical display and converting the format;

FIGS. 5A to 5C are diagrams for explaining a drive timing of a display device;

FIGS. 6A and 6B are diagrams showing a structure and a timing chart of a source signal driver circuit;

FIGS. 7A and 7B are diagrams showing a structure and a timing chart of a gate signal driver circuit;

FIGS. 8A and 8B are diagrams for explaining a write-in order for a case of a general display and switching over between vertical and horizontal display;

FIG. 9 is a diagram for showing a structure of a gate signal line driver circuit having a scanning direction switch over circuit;

FIGS. 10A to 10C are diagrams for explaining a drive timing of a display device for case of vertical and horizontal switch over;

FIGS. 11A and 11B are diagrams showing a structure in the case that the present invention is applied to an EL display device;

FIGS. 12A and 12B are diagrams showing a structure of a display device having an independent two set of driver circuits that is one embodiment of the present invention;

FIGS. 13A to 13C are diagrams showing an example of an electronic apparatus that the present invention is possible to apply;

FIG. 14 is a diagram showing a structure of a source signal line driver circuit in the case of performing a divisional driving;

FIGS. 15A to 15D are diagrams explaining a display and an input order of an image signal in the case of implementing the present invention to the display device performing a divisional driving;

FIGS. 16A to 16D are diagrams showing an example of a manufacturing method of an active matrix type liquid crystal display device;

FIGS. 17A to 17D are diagrams showing an example of a manufacturing method of an active matrix type liquid crystal display device;

FIG. 18 is a diagram showing an example of a manufacturing method of an active matrix type liquid crystal display device.

DETAILED DESCRIPTION OF THE PREFERRED EMBODIMENTS

Embodiment Mode

Figure 1A:
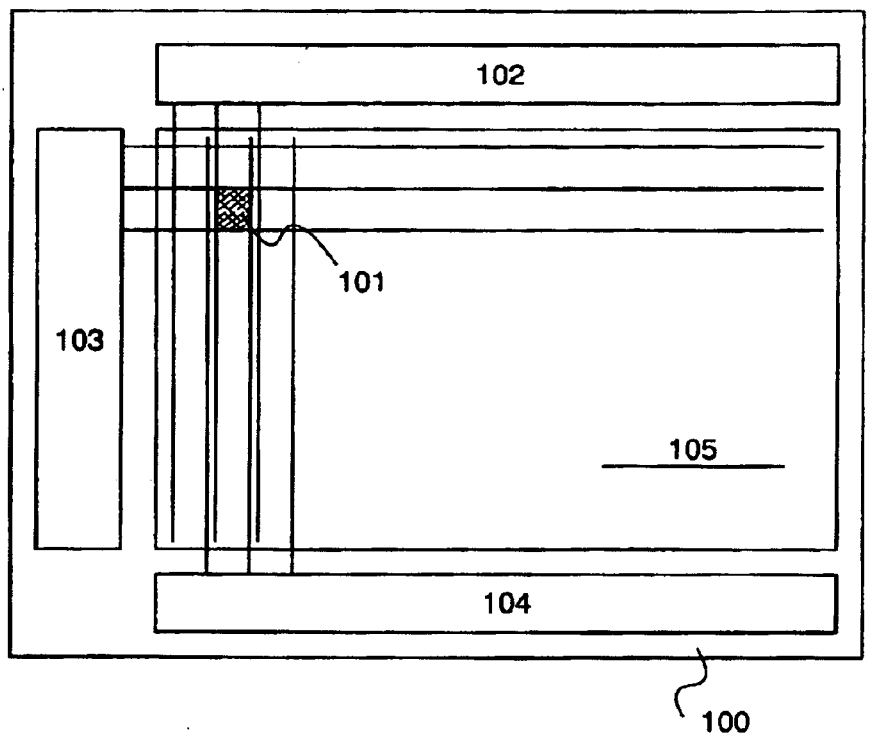
FIGS. 1A and 1B are diagrams showing one embodiment mode of the present invention.

FIG. 1A is a drawing showing an embodiment mode of the present invention. A pixel portion 105, a source signal line driver circuit 102, a first gate signal line driver circuit 103, and a second gate signal line driver circuit 104 are formed on a substrate 100.

Figure 1B:
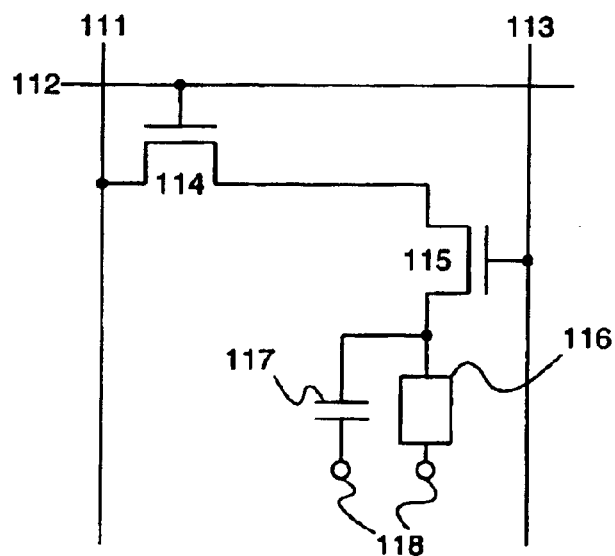
Figure 2A:
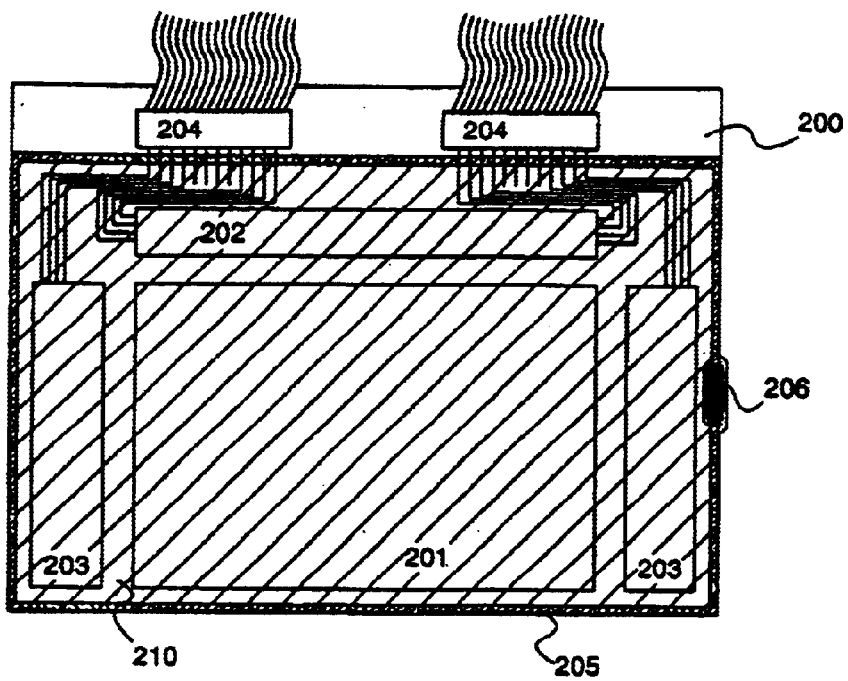
FIGS. 2A to 2C are diagrams showing an outline of the display device used conventionally.
Figure 2B:
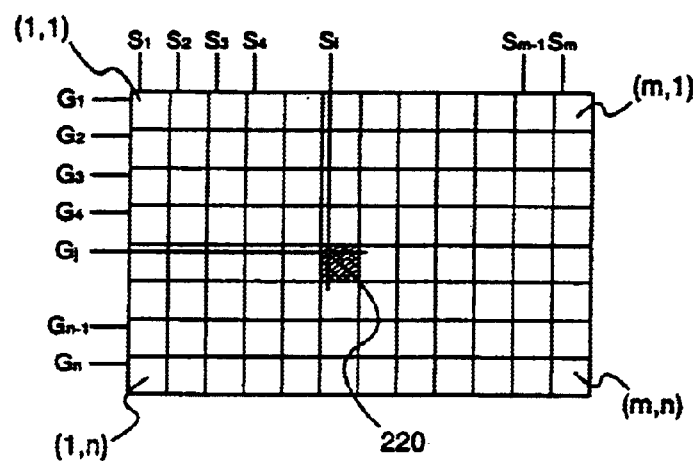
Figure 2C:
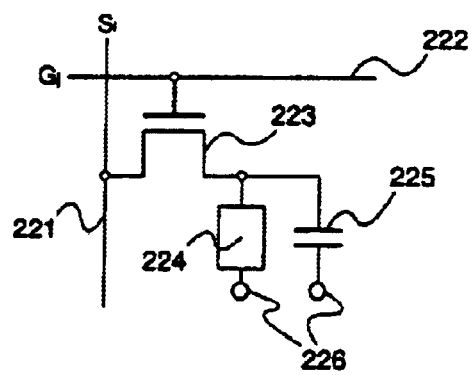
Figure 3A:
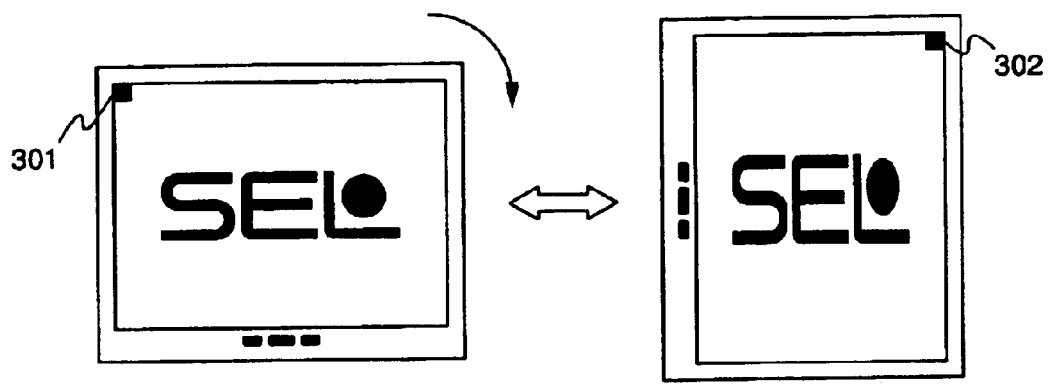
FIGS. 3A and 3B are diagrams for explaining a state of switch over between horizontal and vertical display.
Figure 3B:
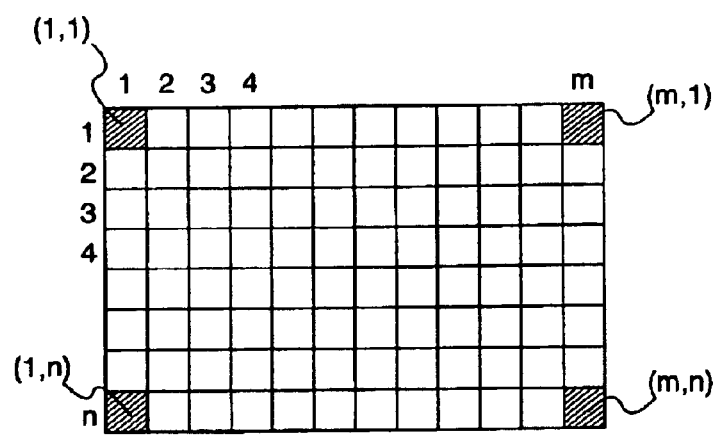

A portion in the pixel portion 105 denoted by reference 101 is one pixel, and a detailed circuit structure is shown in FIG. 1B. One pixel has source signal line 111, a first gate signal line 112, a second gate signal line 113, a first pixel TFT 114, a second pixel TFT 115, a liquid crystal element 116, a storage capacitor 117, and an opposing electrode 118.

A gate electrode of the first pixel TFT 114 is electrically connected to the first gate signal line 112, and on and off control is performed by pulses input to the first gate signal line 112. A gate electrode of the second pixel TFT 115 is electrically connected to the second gate signal line 113, and on and off control is performed by pulses input to the second gate signal line 113.

An image signal input by the source signal line 111 is input to the pixels when both the first pixel TFT 114 and the second pixel TFT 115 are on, and electric charge is then stored in the storage capacitor 117.

Operation of the circuits is explained. Note that there is no specific limitation placed on format converting means for the image signal, and therefore an explanation of a format converting portion is omitted here for simplicity. Here, FIGS. 1A and B, and FIGS. 8A and 8B are referred to for description.

The second gate signal line driver circuit is set such that the second pixel TFTs 115 are turned on across an entire screen for cases of performing a first display, namely normal display. The pixels are thus controlled only by the on and off states of the first pixel TFT. Image display is then performed by driving the source signal line driver circuit and the first gate signal line driver circuit in a manner similar to conventional drive. As shown in FIG. 8A, the write-in order to the pixels becomes (1,1), (2,1), . . . , (m,1), (1,2), (2,2), . . . , (m,2), . . . , (1,n), (2,n), . . . , (m,n).

A case of performing a second display, namely switching the vertical and horizontal axes on a screen, is explained next. FIG. 8B shows a state in which FIG. 8A is rotated clockwise by 90°. The display device of the present invention does not use a frame memory, and therefore the input order for the image signal is not changed. Accordingly, the write-in order to the pixels in the state shown by FIG. 8B becomes (1,n), (1,n−1), . . . , (1,1), (2,n), (2,n−1), . . . , (2,1), . . . , (m,n), (m,n−1), . . . , (m,1).

The source signal line driver circuit is driven at a slower speed than normal speed when performing the second display, and sampling pulses are output per single horizontal period. A sampling switch remains open throughout one horizontal period, and therefore one horizontal period portion of the image signal is continuously written in per single source signal line. On the other hand, the first gate signal line driver circuit is driven at a faster speed than normal speed, and gate signal line selection pulses are output per one dot sampling period. The first pixel TFT is thus only on during one dot sampling period, and the image signal is written in at that time. Further, the second gate signal line driver circuit is driven similarly to the source signal line driver circuit. That is, when the sampling pulses from the source signal line driver circuit are output and the image signal is input to a source signal line of a certain column, the second gate signal line of that column is selected, and all of the second pixel TFTs connected to the selected second gate signal line are turned on. Write in of the image signal is thus approved for only that column.

Write in of the image signal to the pixels can thus be performed in the aforementioned order by the above operations. The present invention enables to perform switch over between horizontal and vertical display without using a frame memory that is essential in the prior art. As a result, the number of component parts decrease and the device is made smaller. Therefore, the present invention is easily applied to compact portable terminals.

Embodiments

Embodiments of the present invention are discussed below.

Embodiment 1

In the case of performing switch over between vertical and horizontal display by the method shown in the embodiment mode, attention is directed to the scanning direction of a first gate signal line driver circuit. During normal display, the first gate signal line driver circuit selects gate signal lines in order from the first row to an nth row, and scanning is performed, as shown in FIG. 8A. Conversely, the first gate signal line driver circuit selects the gate signal lines in opposite order, from the number n row to the number 1 row, and scanning is performed for cases of vertical and horizontal switch over. It therefore becomes necessary to change the scanning direction of the first gate signal line driver circuit when performing switch over between vertical and horizontal display.

The structure of a driver circuit having an added scanning direction switch over circuit is shown in FIG. 9. A shift register 902 using a plurality of stages of flip-flop 901, a NAND 904, and a buffer 905 are similar to those of the conventional example shown in FIG. 7A. A scanning direction switch over signal (UD), and a scanning direction switch over inverted signal (UDb) are input to a scanning direction switch over circuit 903. If the scanning direction switch over signal (UD) is H, and the scanning direction switch over inverted signal (UDb) is L, then selection of the gate signal lines is in sequence of $G_1$, $G_2$, . . . , $G_n$. If the scanning direction switch over signal (UD) is L, and the scanning direction switch over inverted signal (UDb) is H, then selection of the gate signal lines is in sequence of $G_n$, $G_{n-1}$, . . . , $G_1$.

Note that the structure of the driver circuit when implementing the present invention is not limited to the structures of FIGS. 6A, 7A, and 9. For example, it also is possible to implement the present invention for cases of using a decoder as a substitute for a shift register, and the like.

Embodiment 2

An example of a case of performing horizontal and vertical display switch over easily by a method that differs from the embodiment mode is shown in Embodiment 2.

The structure of a display device is shown in FIG. 12A. A pixel portion 1206 is formed on a substrate 1200, and in addition, a first source signal line driver circuit 1202, a first gate signal line driver circuit 1203, a second source signal line driver circuit 1204, and a second gate signal line driver circuit 1205 are formed. The scanning direction of the first source signal line driver circuit and the scanning direction of the second source signal line driver circuit are taken as being mutually perpendicular here. Further, the scanning direction of the first gate signal line driver circuit and the scanning direction of the second gate signal line driver circuit are taken as being mutually perpendicular here.

In the pixel portion 1206, a portion denoted by reference numeral 1201 is one pixel, and its structure is shown in FIG. 12B. One pixel has a first source signal line 1211, a first gate signal line 1212, a second source signal line 1213, a second gate signal line 1214, a first pixel TFT 1215, a second pixel TFT 1216, a liquid crystal element 1217, a storage capacitor 1218, and an opposing electrode 1219.

There are two each of the source signal lines, the gate signal lines, and the pixel TFTs in Embodiment 2, and therefore there are two independent circuit paths for writing in an image signal to the liquid crystal elements. When performing a first display, that is when performing normal display, the first pixel TFT is controlled by operating the first source signal line driver circuit and the first gate signal line driver circuit, for example, and the image signal input to the first source signal line driver circuit 1211 is written into the pixel. The second source signal line driver circuit and the second gate signal line driver circuit are both not operated at this point.

On the other hand, when performing a second display, that is when switching over between the vertical and horizontal of a screen, the second pixel TFT is controlled by operating the second source signal line driver circuit and the second gate signal line driver circuit, and the image signal input to the second source signal line is written into the pixel. The first source signal line driver circuit and the first gate signal line driver circuit are both not operated at this time.

It is thus possible to easily switch over between vertical and horizontal display by controlling one pixel by alternately using two groups of driver circuits.

Embodiment 3

It is possible to implement the present invention not only in the liquid crystal display device shown by the embodiment mode, but also in light emitting devices such as EL display devices. FIGS. 11A and 11B show the structure of an EL display device.

The formation of a pixel portion 1105, a source signal line driver circuit 1102, a first gate signal line driver circuit 1103, and a second gate signal line driver circuit 1104 on a substrate 1100 is similar to the case of the liquid crystal display device shown in FIGS. 1A and 1B. In addition, an EL electric power source 1106 for supplying electric current to an EL element is connected from the outside through an FPC.

The structure of one pixel denoted by reference numeral 1101 in FIG. 11A is shown in FIG. 11B. One pixel portion has a source signal line 1111, a first gate signal line 1112, a second gate signal line 1113, a first switching TFT 1114, a second switching TFT 1115, an EL driver TFT 1116, an EL element 1117, a storage capacitor 1118, and an electric current supply line 1119.

A gate electrode of the first switching TFT 1114 is electrically connected to the first gate signal line 1112, and the first switching TFT 1114 is controlled to turn on and off by pulses input to the first gate signal line 1112. A gate electrode of the second switching TFT 1115 is electrically connected to the second gate signal line 1113, and the second switching TFT 1115 is controlled to turn on and off by pulses input to the second gate signal line 1113.

An image signal input from the source signal line 1111 is input to a gate electrode of the EL driver TFT 1116 when both the first switching TFT 1114 and the second switching TFT 1115 are on, and an electric charge is stored in the storage capacitor 1118.

Analog dot sequence drive similar to that of the embodiment mode may be used for the drive timing and the like, and therefore an explanation thereof is omitted here.

Embodiment 4

It is necessary to drive many pixels within a fixed period of time in a high resolution and large screen display device. The driver frequency becomes high with a conventional driving method, and therefore division drive is often used.

FIG. 14 shows an example of the structure of a source signal line driver circuit for a case of performing division driving, and the structure has a shift register 1402 comprising a plurality of stages of flip-flops 1401, a NAND 1403, a buffer 1404, a sampling switch 1405, and the like.

In contrast to performing write-in of an image signal to one pixel all at once by one sampling pulse with the circuit shown in FIG. 6A, four image signals are input in parallel with the circuit shown in FIG. 14, and write-in of the image signals to four pixels is performed one time by one sampling pulse. The driver frequency of the source signal line driver circuit can thus be lowered by 1/(the number of divisions) as compared to a conventional display device having the same number of pixels. Sampling is performed at four points simultaneously for the case of FIG. 14, and therefore the number of divisions is four, and the driver frequency of the source signal line driver circuit can be reduced to ¼ of its conventional value.

A method of performing switch over between vertical and horizontal display in a display device performing this type of division driving is explained in Embodiment 4.

Referring to FIGS. 15A to 15D, FIG. 15A shows a write-in order for normal display by a display device having a source signal line driver circuit that performs four division driving. Sampling of four pixel portions is performed simultaneously from four image signal lines, and write-in to four pixels (1,1), (2,1), (3,1), and (4,1) is simultaneously performed by a first sampling pulse. Then, write-in is performed simultaneously to four pixels (5,1), (6,1), (7,1), and (8,1) by the next sampling pulse.

Figure 15A:
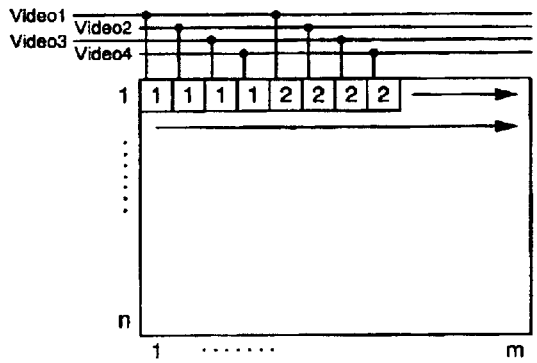
Figure 15B:
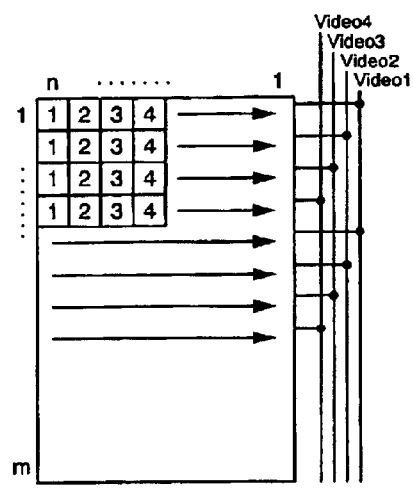
Figure 15C:
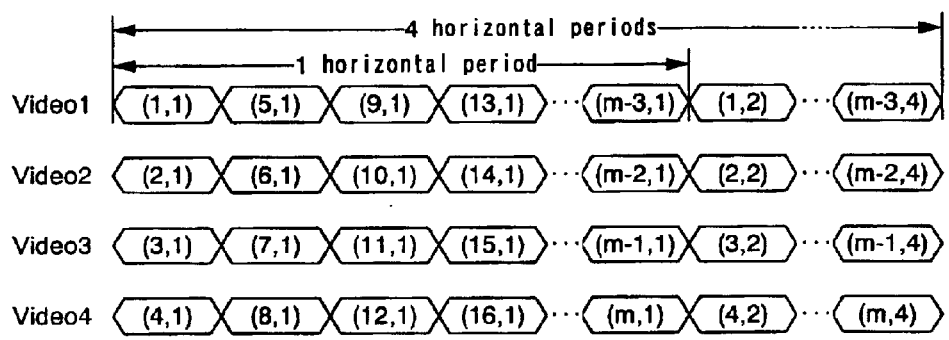

The input order for image signals input to each video signal line (Video1 to Video4) therefore becomes as shown in FIG. 15C.

FIG. 15B shows a write-in order for a case of switching over between vertical and horizontal display with the display device shown in FIG. 15A. Sampling is performed simultaneously at four points lined up in the horizontal direction with normal display, while sampling is performed simultaneously at four points lined up in the vertical direction for cases of performing switch over between the horizontal and vertical directions.

The pixels into which write-in is first performed simultaneously with normal display are the four pixels (1,1), (2,1), (3,1), and (4,1). The pixels into which write-in is first performed simultaneously with switch over between horizontal and vertical directions are the four pixels (1,n), (2,n), (3,n), and (4,n).

Image signals that must be written into the four pixels (1,n), (2,n), (3,n), and (4,n) are the image signals that must be written into the four pixels (1,1), (1,2), (1,3), and (1,4) during normal display.

Figure 15D:
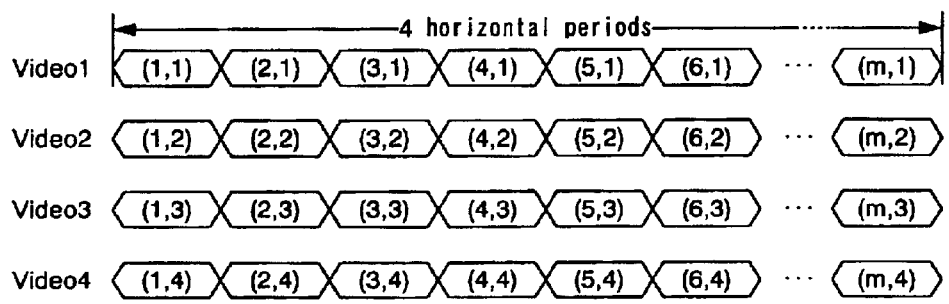

The input order for the image signals input to each of the video signal lines (Video1 to Video4) therefore becomes as shown in FIG. 15D for cases of switching over between vertical and horizontal display.

In this case, a procedure for performing rearrangement of the image signals corresponding to four horizontal periods is necessary, and therefore memory for storing the four horizontal period portions of the image signal is necessary. However, as compared with a case where a frame memory is necessary as in a conventional display device, the memory capacity may be extremely small.

It is thus possible to implement the present invention in display devices that perform division driving.

Embodiment 5

In this embodiment, a method of simultaneously manufacturing a pixel portion and TFTs (n-channel TFTs and a p-channel TFT) of a driver circuit provided in the periphery of the pixel portion on the same substrate is described in detail.

See FIG. 16. First, a base insulating film 5002 is formed on a substrate 5001, and a first semiconductor film having a crystalline structure is obtained. Then, the semiconductor film is etched to have a desired shape to form semiconductor layers 5003 to 5006 separated from one another in an island shape.

A glass substrate (#1737) is used as the substrate 5001. For the base insulating film 5002, a silicon oxynitride film 5002a formed from $SiH_4$, $NH_3$, and $N_2O$ as material gases (composition ratio: Si=32%, O=27%, N=24%, H=17%) is formed with a thickness of 50 nm (preferably 10 to 200 nm) and at a film deposition temperature of 400° C. by using plasma CVD. Then, after the surface is cleaned with ozone water, an oxide film on the surface is removed by means of dilute hydrofluoric acid (dilution with 1/100). Next, a silicon hydride oxynitride film 5002b formed from $SiH_4$ and $N_2O$ as material gases (composition ratio: Si=32%, O=59%, N=7%, H=2%) is formed thereon with a thickness of 100 nm (preferably 50 to 200 nm) and at a film deposition temperature of 400° C. by using plasma CVD to thereby form a lamination. Further, without exposure to an atmosphere, a semiconductor film having an amorphous structure (in this case, amorphous silicon film) is formed to have a thickness of 54 nm (preferably 25 to 80 nm) with $SiH_4$ as a film deposition gas and at a film deposition temperature of 300° C. by using plasma CVD.

In this embodiment, the base film 5002 is shown in a form of a two-layer structure, but a single layer of the insulating film or a structure in which two or more layers thereof are laminated may be adopted. Further, there is no limitation on the material of the semiconductor film. However, the semiconductor film may be preferably formed of silicon or silicon germanium ($Si_xGe_{1-x}$ (X=0.0001 to 0.02)) alloy by using a known means (sputtering, LPCVD, plasma CVD, or the like). Further, a plasma CVD apparatus may be a single wafer type one or a batch type one. In addition, the base insulating film and the semiconductor film may be continuously formed in the same film formation chamber without exposure to an atmosphere.

Subsequently, after the surface of the semiconductor film having an amorphous structure is cleaned, an extremely thin oxide film with a thickness of about 2 nm is formed from ozone water on the surface. Then, in order to control a threshold value of a TFT, doping of a minute amount of impurity element (boron or phosphorous) is performed. Here, an ion doping method is used in which diborane ($B_2H_6$) is plasma-excited without mass-separation, and boron is added to the amorphous silicon film under the doping conditions: an acceleration voltage of 15 kV; a gas flow rate of diborane diluted to 1% with hydrogen of 30 sccm; and a dosage of $2\times10^{12}/cm^2$.

Then, a nickel acetate salt solution containing nickel of 10 ppm in weight is applied using a spinner. Instead of the application, a method of spraying nickel elements to the entire surface by sputtering may also be used.

Then, heat treatment is conducted to perform crystallization, thereby forming a semiconductor film having a crystalline structure. A heating process using an electric furnace or irradiation of strong light may be conducted for this heat treatment. In case of the heating process using an electric furnace, it may be conducted at 500 to 650° C. for 4 to 24 hours. Here, after the heating process (500° C. for 1 hour) for dehydrogenation is conducted, the heating process (550° C. for 4 hours) for crystallization is conducted, thereby obtaining a silicon film having a crystalline structure. Note that, although crystallization is performed by using the heating process using a furnace, crystallization may be performed by means of a lamp annealing apparatus. Also, note that, although a crystallization technique using nickel as a metal element that promotes crystallization of silicon is used here, other known crystallization techniques, for example, a solid-phase growth method and a laser crystallization method, may be used.

Next, after the oxide film on the surface of the silicon film having a crystalline structure is removed by dilute hydrofluoric acid or the like, irradiation of first laser light (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser or a CW laser are used for the laser light. In any case, pulse laser light with a repetition frequency of approximately 10 to 1000 Hz is used, the pulse laser light is condensed to 100 to 500 $mJ/cm^2$ by an optical system, and irradiation is performed with an overlap ratio of 90 to 95%, whereby the silicon film surface may be scanned. Here, the irradiation of the first laser light is performed in an atmosphere with a repetition frequency of 30 Hz and energy density of 393 $mJ/cm^2$. Note that an oxide film is formed on the surface by the first laser light irradiation since the irradiation is conducted in an atmosphere or in an oxygen atmosphere.

Next, after the oxide film formed by the first light irradiation is removed by dilute hydrofluoric acid, second laser light irradiation is performed in a nitrogen atmosphere or in a vacuum, thereby leveling the semiconductor film surface. Excimer laser light with a wavelength of 400 nm or less, or second harmonic wave or third harmonic wave of a YAG laser, or a CW laser are used as the laser light (second laser light). The energy density of the second laser light is made larger than that of the first laser light, preferably made larger by 30 to 60 $mJ/cm^2$. Here, the second laser light irradiation is performed with a repetition frequency of 30 Hz and energy density of 453 $mJ/cm^2$ to thereby set a P-V value of unevenness in the semiconductor film surface to 5 nm or less.

Further, although the second laser light irradiation is conducted over the surface in this embodiment, a step of selectively performing irradiation at least on a pixel portion may be adopted since the reduction of an off current particularly has an effect on a TFT of the pixel portion. Otherwise, the treatment can be performed by only once laser irradiation.

Next, the surface is processed with ozone water for 120 seconds, thereby forming a barrier layer (not illustrated) comprised of an oxide film with a thickness of 1 to 5 nm in total.

Then, an amorphous silicon film containing an argon element, which becomes a gettering site, is formed on the barrier layer to have a thickness of 150 nm by sputtering. The film deposition conditions with sputtering in this embodiment are: a film deposition pressure of 0.3 Pa; a gas (Ar) flow rate of 50 sccm; a film deposition power of 3 kW; and a substrate temperature of 150° C. Note that under the above conditions, the atomic concentration of the argon element contained in the amorphous silicon film is $3\times10^{20}$ atoms/$cm^3$ to $6\times10^{20}$ atoms/$cm^3$, and the atomic concentration of oxygen is $1\times10^{19}$ atoms/$cm^3$ to $3\times10^{19}$ atoms/$cm^3$. Thereafter, heat treatment at 650° C. for 3 minutes is conducted using the lamp annealing apparatus to perform gettering.

Subsequently, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer comprised of the oxide film is removed after gettering.

Then, after a thin oxide film is formed from ozone water on the surface of the obtained silicon film having a crystalline structure (also referred to as polysilicon film), a mask made of resist is formed, and an etching process is conducted thereto to obtain a desired shape, thereby forming the island-like semiconductor layers 5003 to 5006 separated from one another. After the formation of the semiconductor layers, the mask made of resist is removed.

Then, the oxide film is removed with the etchant containing hydrofluoric acid, and at the same time, the surface of the silicon film is cleaned. Thereafter, an insulating film containing silicon as its main constituent, which becomes a gate insulating film 5007, is formed. In this embodiment, a silicon oxynitride film (composition ratio: Si=32%, O=59%, N=7%, H=2%) is formed with a thickness of 115 nm by plasma CVD.

Figure 16A:
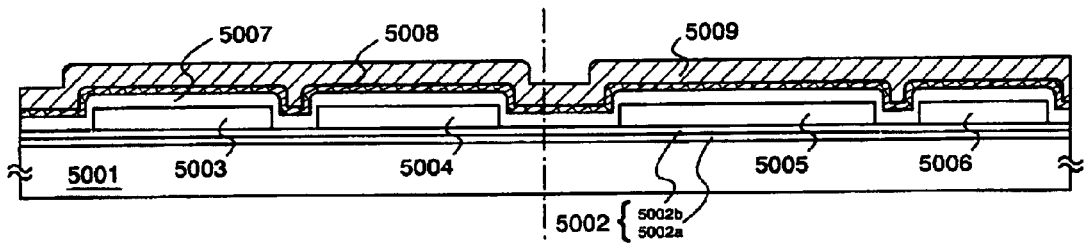

On the gate insulating film 5007, a first conductive film 5008 with a thickness of 20 to 100 nm and a second conductive film 5009 with a thickness of 100 to 400 nm are formed in lamination. In this embodiment, a 50 nm thick tantalum nitride film and a 370 nm thick tungsten film are sequentially laminated on the gate insulating film 5007. (FIG. 16A)

As a conductive material for forming the first conductive film and the second conductive film, an element selected from the group consisting of Ta, W, Ti, Mo, Al and Cu, or an alloy material or compound material containing the above element as its main constituent is employed. Further, a semiconductor film typified by a polycrystalline silicon film doped with an impurity element such as phosphorous, or an AgPdCu alloy may be used as the first conductive film and the second conductive film. Further, the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. In addition, a single layer structure may also be adopted.

Figure 16B:
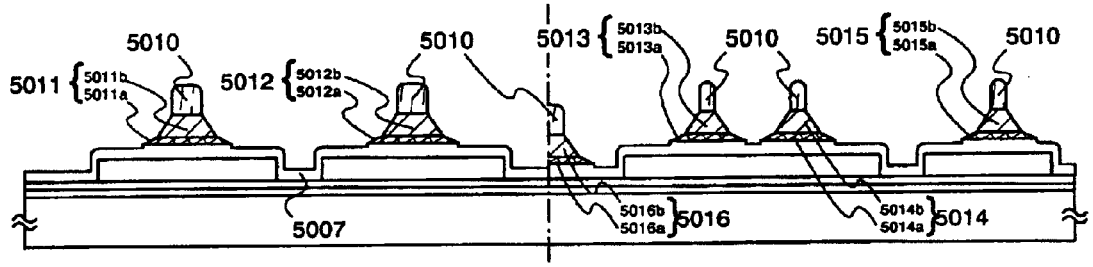
Figure 16C:
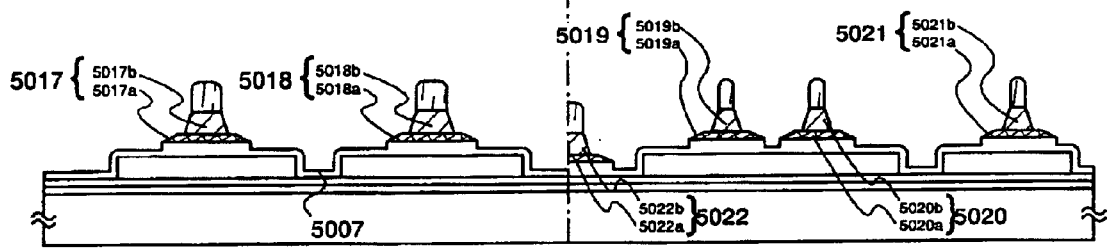

Next, as shown in FIG. 16B, mask 5010 are formed by an exposure step, and a first etching process for forming gate electrodes and wirings is performed. The first etching process is performed with first and second etching conditions. An ICP (inductively coupled plasma) etching method may be preferably used for the etching process. The ICP etching method is used, and the etching conditions (an electric energy applied to a coil-shape electrode, an electric energy applied to an electrode on a substrate side, a temperature of the electrode on the substrate side, and the like) are appropriately adjusted, whereby a film can be etched to have a desired taper shape. Note that chlorine-based gases typified by $Cl_2$, $BCl_3$, $SiCl_4$, and $CCl_4$, fluorine-based gases typified by $CF_4$, $SF_6$, and $NF_3$, and $O_2$ can be appropriately used as etching gases.

In this embodiment, RF (13.56 MHz) power of 150 W is applied also to the substrate (sample stage) to substantially apply a negative self-bias voltage. With the first etching conditions, a W film is etched to form an end portion of the first conductive layer into a tapered shape. Under the first etching conditions, an etching rate to W is 200.39 nm/min, an etching rate to TaN is 80.32 nm/min, and a selection ratio of W to TaN is about 2.5. Further, with the first etching conditions, a taper angle of W is approximately 26°. Thereafter, the first etching conditions are changed to the second etching conditions without removing the mask 5010 made of resist. $CF_4$ and $Cl_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 30 seconds. RF (13.56 MHz) power of 20 W is also applied to the substrate side (sample stage) to substantially apply a negative self-bias voltage. Under the second etching conditions in which $CF_4$ and $Cl_2$ are mixed, both the W film and the TaN film are etched at the same level. With the second etching conditions, an etching rate to W is 58.97 nm/min, and an etching rate to TaN is 66.43 nm/min. Note that an etching time may be increased by 10 to 20% in order to conduct etching without remaining residue on the gate insulating film.

In the first etching process as described above, the shape of the mask made of resist is made appropriate, whereby the end portion of the first conductive layer and the end portion of the second conductive layer each have a tapered shape due to the effect of the bias voltage applied to the substrate side. The angle of the tapered portion is sufficiently set to 15 to 45°.

Thus, first shape conductive layers 5011 to 5016 composed of the first conductive layer and the second conductive layer (first conductive layers 5011a to 5016a and second conductive layers 5011b to 5016b) are formed by the first etching process. The insulating film 5007 that becomes the gate insulating film is etched by approximately 10 to 20 nm, and becomes a gate insulating film in which regions which are not covered by the first shape conductive layers 5011 to 5016 are thinned.

Next, a second etching process is conducted without removing the masks made of resist. Here, $SF_6$, $Cl_2$ and $O_2$ are used as etching gases, the flow rate of the gases is set to 24/12/24 sccm, and RF (13.56 MHz) power of 700 W is applied to a coil-shape electrode with a pressure of 1.3 Pa to generate plasma, thereby performing etching for 25 seconds. RF (13.56 MHz) power of 10 W is also applied to the substrate side (sample stage) to substantially apply a negative self-bias voltage. In the second etching process, an etching rate to W is 227.3 nm/min, an etching rate to TaN is 32.1 nm/min, a selection ratio of W to TaN is 7.1, an etching rate to SiON that is the gate insulating film 5007 is 33.7 nm/min, and a selection ratio of W to SiON is 6.83. In the case where $SF_6$ is used as the etching gas, the selection ratio with respect to the gate insulating film 5007 is high as described above. Thus, reduction in the film thickness can be suppressed. In this embodiment, the film thickness of the gate insulating film 5007 is reduced by only about 8 nm.

By the second etching process, the taper angle of W becomes 70°. By the second etching process, second conductive layers 5017 to 5022 are formed. On the other hand, the first conductive layers are hardly etched to become first conductive layers 5017a to 5022a. Note that the first conductive layers 5017a to 5022a have substantially the same size as the first conductive layers 5011a to 5016a. In actuality, the width of the first conductive layer may be reduced by approximately 0.3 $\mu$m, namely, approximately 0.6 $\mu$m in the total line width in comparison with before the second etching process. However, there is almost no change in size of the first conductive layer.

Further, in the case where, instead of the two-layer structure, the three-layer structure is adopted in which a 50 nm thick tungsten film, an alloy film of aluminum and silicon (Al—Si) with a thickness of 500 nm, and a 30 nm thick titanium nitride film are sequentially laminated, under the first etching conditions of the first etching process in which: $BCl_3$, $Cl_2$ and $O_2$ are used as material gases; the flow rate of the gases is set to 65/10/5 (sccm); RF (13.56 MHz) power of 300 W is applied to the substrate side (sample stage); and RF (13.56 MHz) power of 450 W is applied to a coil-shape electrode with a pressure of 1.2 Pa to generate plasma, etching is performed for 117 seconds. As to the second etching conditions of the first etching process, $CF_4$, $Cl_2$ and $O_2$ are used, the flow rate of the gases is set to 25/25/10 sccm, RF (13.56 MHz) power of 20 W is also applied to the substrate side (sample stage); and RF (13.56 MHz) power of 500 W is applied to a coil-shape electrode with a pressure of 1 Pa to generate plasma. With the above conditions, it is sufficient that etching is performed for about 30 seconds. In the second etching process, $BCl_3$ and $Cl_2$ are used, the flow rate of the gases are set to 20/60 sccm, RF (13.56 MHz) power of 100 W is applied to the substrate side (sample stage), and RF (13.56 MHz) power of 600 W is applied to a coil-shape electrode with a pressure of 1.2 Pa to generate plasma, thereby performing etching.

Figure 16D:
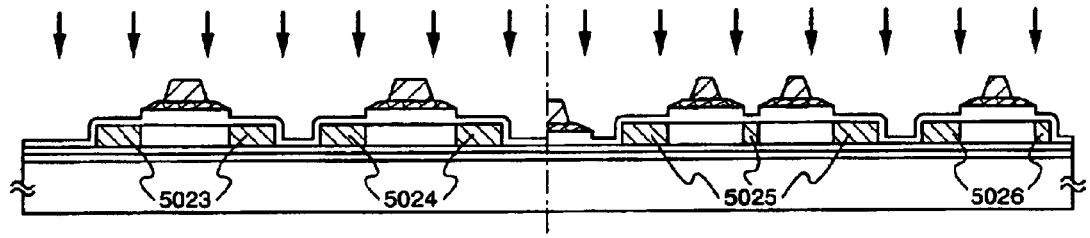

Next, the masks made of resist are removed, and then, a first doping process is conducted to obtain the state of FIG. 16D. The doping process may be conducted by ion doping or ion implantation. Ion doping is conducted with the conditions of a dosage of $1.5 \times 10^{14}$ atoms/cm$^2$ and an accelerating voltage of 60 to 100 keV. As an impurity element imparting n-type conductivity, phosphorous (P) or arsenic (As) is typically used. In this case, first conductive layers and second conductive layers 5017 to 5021 become masks against the impurity element imparting n-type conductivity, and first impurity regions 5023 to 5026 are formed in a self-aligning manner The impurity element imparting n-type conductivity is added to the first impurity regions 5023 to 5026 in a concentration range of $1 \times 10^{16}$ to $1 \times 10^{17}$ atoms/cm$^3$. Here, the region having the same concentration range as the first impurity region is also called an n$^-$ region.

Note that although the first doping process is performed after the removal of the masks made of resist in this embodiment, the first doping process may be performed without removing the masks made of resist.

Figure 17A:
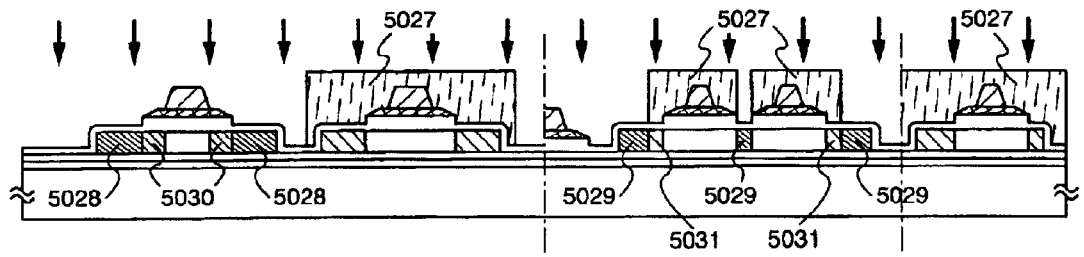

Subsequently, as shown in FIG. 17A, mask 5027 made of resist are formed, and a second doping process is conducted. With the ion doping conditions in the second doping process: a dosage of $1.5 \times 10^{15}$ atoms/cm$^2$; and an accelerating voltage of 60 to 100 keV, phosphorous (P) is doped. Here, impurity regions are formed in the respective semiconductor layers in a self-aligning manner with the second conductive layers 5017b to 5021b as masks. Of course, phosphorous is not added to the regions covered by the mask 5027. Thus, second impurity regions 5028 and 5029 and a third impurity region 5030 are formed. The impurity element imparting n-type conductivity is added to the second impurity regions 5028 and 5029 in a concentration range of $1 \times 10^{20}$ to $1 \times 10^{21}$ atoms/cm$^3$. Here, the region having the same concentration range as the second impurity region is also called an n$^+$ region.

Further, the third impurity region is formed at a lower concentration than that in the second impurity region by the first conductive layer 5017a, and is added with the impurity element imparting n-type conductivity in a concentration range of $1 \times 10^{18}$ to $1 \times 10^{19}$ atoms/cm$^3$. Note that since doping is conducted by passing the portion of the first conductive layer 5017a having a tapered shape, the third impurity region has a concentration gradient in which an impurity concentration increases toward the end portion of the tapered portion. Here, the region having the same concentration range as the third impurity region is called an n$^-$ region. Furthermore, the regions covered by the mask 5027 are not added with the impurity element in the second doping process, and become first impurity regions.

Figure 17B:
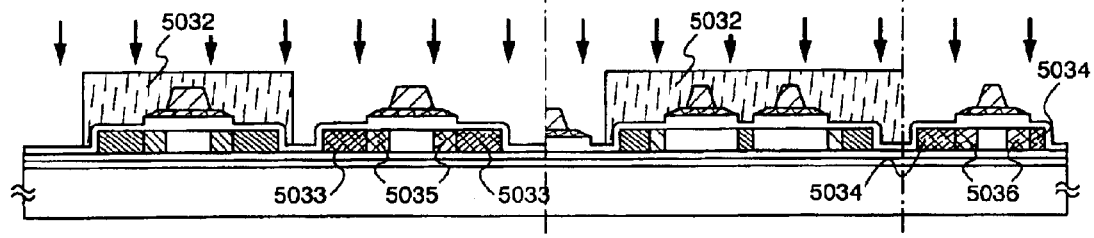
Figure 17C:
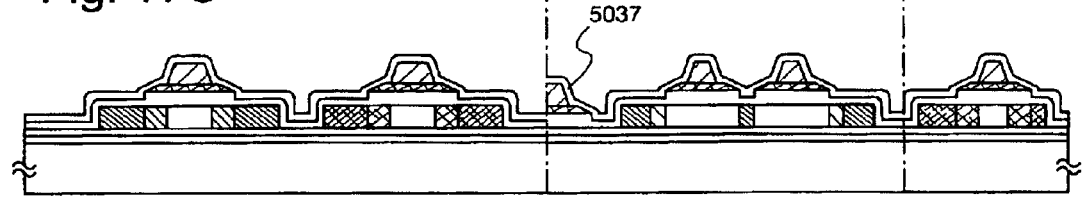

Next, after the mask 5027 made of resist are removed, mask 5032 made of resist are newly formed, and a third doping process is conducted as shown in FIG. 17B.

In the driver circuit, by the third doping process as described above, fourth impurity regions 5033, 5034 and fifth impurity regions 5035, 5036 are formed in which an impurity element imparting p-type conductivity is added to the semiconductor layer forming the p-channel TFT and to the semiconductor layer forming the storage capacitor.

Further, the impurity element imparting p-type conductivity is added to the fourth impurity regions 5033 and 5034 in a concentration range of $1 \times 10^{20}$ to $1 \times 10^{21}$ atoms/cm$^3$. Note that, in the fourth impurity regions 5033, 5034, phosphorous (P) has been added in the preceding step (n$^-$ region), but the impurity element imparting p-type conductivity is added at a concentration that is 1.5 to 3 times as high as that of phosphorous. Thus, the fourth impurity regions 5033, 5034 have a p-type conductivity. Here, the region having the same concentration range as the fourth impurity region is also called a p$^+$ region.

Further, fifth impurity regions 5035 and 5036 are formed in regions overlapping the tapered portion of the second conductive layers 5018a and 5021a, and are added with the impurity element imparting p-type conductivity in a concentration range of $1 \times 10^{18}$ to $1 \times 10^{20}$ atoms/cm$^3$. Here, the region having the same concentration range as the fifth impurity region is also called a p$^-$ region.

Through the above-described steps, the impurity regions having n-type or p-type conductivity are formed in the respective semiconductor layers. The conductive layers 5017 to 5020 become gate electrodes of a TFT. Further, the conductive layer 5021 becomes one of electrodes, which forms the storage capacitor in the pixel portion. Moreover, the conductive layer 5022 forms a source wiring in the pixel portion.

Next, an insulating film (not illustrated) that covers substantially the entire surface is formed. In this embodiment, a 50 nm thick silicon oxide film is formed by plasma CVD. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or excimer laser from the back surface, heat treatment using a furnace, or a combination thereof is employed.

Further, although an example in which the insulating film is formed before the activation is shown in this embodiment, a step of forming the insulating film may be conducted after the activation is conducted.

Next, a first interlayer insulating film 5037 is formed of a silicon nitride film, and heat treatment (300 to 550° C. for 1 to 12 hours) is performed, thereby conducting a step of hydrogenating the semiconductor layers. (FIG. 17C) This step is a step of terminating dangling bonds of the semiconductor layers by hydrogen contained in the first interlayer insulating film 5037. The semiconductor layers can be hydrogenated irrespective of the existence of an insulating film (not illustrated) formed of a silicon oxide film. Incidentally, in this embodiment, a material containing aluminum as its main constituent is used for the second conductive layer, and thus, it is important to apply the heating process condition that the second conductive layer can withstand in the step of hydrogenation. As another means for hydrogenation, plasma hydrogenation (using hydrogen excited by plasma) may be conducted.

Next, a second interlayer insulating film 5038 is formed from an organic insulating material on the first interlayer insulating film 5037. In this embodiment, an acrylic resin film with a thickness of 1.6 µm is formed. Then, a contact hole that reach the respective electrodes and impurity regions are formed. In this embodiment, pluralities of etching processes are sequentially performed. In this embodiment, the second interlayer insulting film is etched with the first interlayer insulating film as the etching stopper, the first interlayer insulating film is etched with the insulating film (not illustrated) as the etching stopper, and then, the insulating film (not illustrated) is etched.

Thereafter, wirings and pixel electrode are formed by using Al, Ti, Mo, W and the like. As the material of the electrodes and pixel electrode, it is desirable to use a material excellent in reflecting property, such as a film containing Al or Ag as its main constituent or a lamination film of the above film. Thus, wirings 5039 to 5042, a pixel electrode 5043, and a gate signal line 5044 are formed.

As described above, a driver circuit having an n-channel TFT and a p-channel TFT, a pixel TFT comprised of an n-channel TFT and a pixel portion having a storage capacitor can be formed on the same substrate. (FIG. 17D) In this specification, the above substrate is called an active matrix substrate for the sake of convenience.

Figure 17D:
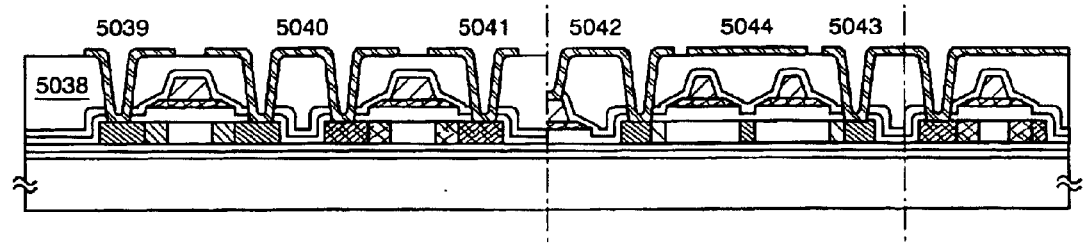

In the active matrix substrate shown in FIG. 17D, n-channel TFT has two kinds of structures. One of the structures is GOLD structure having the third impurity region overlapping with the gate electrode that can be seen in n-channel TFT of the driver circuit, the other is LDD structure having the first impurity region not overlapping with the gate electrode that can be seen in the pixel TFT.

The former structure is to be effective for restraint of hot carrier deterioration, particularly for a region where an operation needs for reliability. The latter structure is to be effective for leak reduction of an OFF current, for circuits that is applied negative bias voltage in many times, and for circuits that control a pixel portion.

On the other hand, an opposite substrate 5045 is prepared. In the opposite substrate side, an opposite electrode 5046 is formed from the transparent electrode.

On the active matrix substrate and the opposite substrate, orientation films 5047 and 5048 are formed respectively and rubbing process is performed. In this embodiment, a column shape spacer (not illustrated) is formed using an acrylic resin and the like at a desired portion in order to secure a gap between substrates before forming the orientation film 5048 in the active matrix substrate side. A spherical shape spacer can be scattered on the entire surface of the substrate as a substitute for a column shape spacer.

The active matrix substrate and the opposite substrate that have a pixel portion and the driver circuit are pasted each other with a sealing material (not illustrated). Filler is mixed in the sealing material. The filler and the column shape spacer make a uniform gap between two substrates. A liquid crystal material 5049 is injected to the gap between both substrates, and the gap is sealed completely with the sealing agent (not illustrated). A known material liquid crystal material can be used for the liquid crystal material 5049. In case of necessity, the active matrix substrate or the opposite substrate are divided into desired shapes. In addition, a polarizing plate is provided appropriately by using a known method. In addition, FPC is applied to the substrate by using a known method. In such a manner, an active matrix type liquid crystal display device is complete as shown in FIG. 18.

In this embodiment, a manufacturing method of the liquid crystal display device is described. However, the present invention is not limited to a use of a liquid crystal display device. When the light-emitting device is formed by using an EL element, manufacturing an active matrix substrate can be followed methods with reference to FIGS. 16 to 17 in this embodiment. In future, an active matrix type light-emitting device can be formed if an EL element that is made from an anode, a positive hole transporting layer, a light emitting layer, an electron injecting layer, and a cathode is formed on the active matrix substrate.

Embodiment 6

Accordingly, the present invention may be used as a display portion of various electric devices. As electronic equipments there are: a display device; a portable information terminal (such as an electronic book, a mobile computer, and a cellular phone), and the like. Examples of these are shown in FIG. 13.

FIG. 13A shows a liquid crystal display, or an EL display, and contains a casing 3001, a support stand 3002, and a display portion 3003. The present invention can be used as the display portion 3003. In the case performing switch over between horizontal and vertical display, a revolving system is provided at a mount portion of the casing 3001 to fit the support stand 3002 in order to revolve the casing 3001 itself.

FIG. 13B shows a portable information terminal, and contains a main body 3031, a stylus 3032, a display portion 3034, and an external interface 3035. The present invention can be used as the display portion 3033.

FIG. 13C shows a cellular phone, and contains a main body 3061, a sound output portion 3062, a sound input portion 3063, a display portion 3064, an operation button 3065, and an antenna 3066. The present invention can be used to the display portion 3064.

Examples shown in this embodiment is quite one example. It should be mentioned that the present invention is not limited to these uses.

By the present invention, the display device that can perform easily switch over between horizontal and vertical display without using a frame memory and the like can be provided. Therefore, the display device become possible to easily applied to a small portable terminals and the like that are limited the number of parts.

What is claimed is:

1. A display device comprising:

a conversion portion for obtaining a second signal by converting the format of a first image signal; and a display portion inputted one of the first image signal or the second image signal;

wherein the first image signal is input to the display portion and a first image is displayed therein, and wherein the second image signal is input to the display portion, and a second image having a display direction rotated by 90° with respect to the first image is displayed.

2. A display device comprising:

a display portion, the display portion comprising a source signal line driver circuit, a first gate signal line driver circuit, a second gate signal line driver circuit, and a plurality of pixels formed over a same substrate, wherein a scanning direction of the first gate signal line driver circuit and a scanning direction of the second gate signal line driver circuit are orthogonal.

3. A display device comprising:

a display portion, the display portion comprising a source signal line driver circuit, a first gate signal line driver circuit, a second gate signal line driver circuit, and a plurality of pixels formed over a same substrate, wherein the plurality of pixels each have a source signal line, a first gate signal line, a second gate signal line orthogonal to the first gate signal line, a first transistor, and a second transistor, wherein a gate electrode of the first transistor is electrically connected to the first gate signal line, an input electrode of the first transistor is electrically connected to the source signal line, and an output electrode of the first transistor is electrically connected to an input electrode of the second transistor, and wherein a gate electrode of the second transistor is electrically connected to the second gate signal line.

4. The display device according to claim 1, wherein:

the driver frequency of the source signal line driver circuit is higher than the driver frequency of the first gate signal line driver circuit when displaying a first image; and the driver frequency of the source signal line driver circuit is lower than the driver frequency of the first gate signal line driver circuit when displaying a second image.

5. The display device according to claim 2, wherein:

the driver frequency of the source signal line driver circuit is higher than the driver frequency of the first gate signal line driver circuit when displaying a first image; and the driver frequency of the source signal line driver circuit is lower than the driver frequency of the first gate signal line driver circuit when displaying a second image.

6. The display device according to claim 3, wherein:

the driver frequency of the source signal line driver circuit is higher than the driver frequency of the first gate signal line driver circuit when displaying a first image; and the driver frequency of the source signal line driver circuit is lower than the driver frequency of the first gate signal line driver circuit when displaying a second image.

7. A display device comprising:
a display portion, the display portion comprising a first source signal line driver circuit, a second source signal line driver circuit, a first gate signal line driver circuit, a second gate signal line driver circuit, and a plurality of pixels formed over a same substrate,
wherein a scanning direction of the first gate signal line driver circuit and a scanning direction of the second gate signal line driver circuit are orthogonal.

8. A display device comprising:
a display portion, the display portion comprising a first source signal line driver circuit, a second source signal line driver circuit, a first gate signal line driver circuit, a second gate signal line driver circuit, and a plurality of pixels formed over a same substrate,
wherein the plurality of pixels each have a first source signal line, a second source signal line, a first gate signal line, a second gate signal line orthogonal to the first gate signal line, a first transistor, and a second transistor,
wherein a gate electrode of the first transistor is electrically connected to the first gate signal line, an input electrode of the first transistor is electrically connected to the first source signal line, and
wherein a gate electrode of the second transistor is electrically connected to the second gate signal line, and the input electrode is electrically connected to the second source signal line.

9. The display device according to claim 1, wherein:
an image is displayed in accordance with a scanning direction of the first gate signal line driver circuit when displaying the first image; and
an image is displayed in accordance with a scanning direction of the second gate signal line driver circuit when displaying the second image.

10. The display device according to claim 2, wherein:
an image is displayed in accordance with a scanning direction of the first gate signal line driver circuit when displaying the first image; and
an image is displayed in accordance with a scanning direction of the second gate signal line driver circuit when displaying the second image.

11. The display device according to claim 3, wherein:
an image is displayed in accordance with a scanning direction of the first gate signal line driver circuit when displaying the first image; and
an image is displayed in accordance with a scanning direction of the second gate signal line driver circuit when displaying the second image.

12. The display device according to claim 7, wherein:
an image is displayed in accordance with a scanning direction of the first gate signal line driver circuit when displaying the first image; and
an image is displayed in accordance with a scanning direction of the second gate signal line driver circuit when displaying the second image.

13. The display device according to claim 8, wherein:
an image is displayed in accordance with a scanning direction of the first gate signal line driver circuit when displaying the first image; and
an image is displayed in accordance with a scanning direction of the second gate signal line driver circuit when displaying the second image.

14. The display device according to claim 1,
wherein each of the plurality of pixels has means for applying a driver voltage to a liquid crystal element or means for supplying electric current to a light emitting element.

15. The display device according to claim 2,
wherein each of the plurality of pixels has means for applying a driver voltage to a liquid crystal element or means for supplying electric current to a light emitting element.

16. The display device according to claim 3,
wherein each of the plurality of pixels has means for applying a driver voltage to a liquid crystal element or means for supplying electric current to a light emitting element.

17. The display device according to claim 7,
wherein each of the plurality of pixels has means for applying a driver voltage to a liquid crystal element or means for supplying electric current to a light emitting element.

18. The display device according to claim 8,
wherein each of the plurality of pixels has means for applying a driver voltage to a liquid crystal element or means for supplying electric current to a light emitting element.

19. The display device according to claim 1, wherein the display device is used as a display portion of an electronic equipment selected from the group consisting of a liquid crystal display, an electronic book, a mobile computer, a cellular phone.

20. The display device according to claim 2, wherein the display device is used as a display portion of an electronic equipment selected from the group consisting of a liquid crystal display, an electronic book, a mobile computer, a cellular phone.

21. The display device according to claim 3, wherein the display device is used as a display portion of an electronic equipment selected from the group consisting of a liquid crystal display, an electronic book, a mobile computer, a cellular phone.

22. The display device according to claim 7, wherein the display device is used as a display portion of an electronic equipment selected from the group consisting of a liquid crystal display, an electronic book, a mobile computer, a cellular phone.

23. The display device according to claim 8, wherein the display device is used as a display portion of an electronic equipment selected from the group consisting of a liquid crystal display, an electronic book, a mobile computer, a cellular phone.

24. A display device according to claim 2, wherein the display device further comprises a conversion portion for converting a first image signal into a second image signal by format conversion, operationally connected with the display portion.

25. A display device according to claim 3, wherein the display device further comprises a conversion portion for converting a first image signal into a second image signal by format conversion, operationally connected with the display portion.

26. A display device according to claim 7, wherein the display device further comprises a conversion portion for converting a first image signal into a second image signal by format conversion, operationally connected with the display portion.

27. A display device according to claim 8, wherein the display device further comprises a conversion portion for converting a first image signal into a second image signal by format conversion, operationally connected with the display portion.

* * * * *